(12) United States Patent
Park et al.

(10) Patent No.: US 12,144,228 B2
(45) Date of Patent: Nov. 12, 2024

(54) TRANSPARENT DISPLAY DEVICE WITH TOUCH SENSOR

(71) Applicant: LG Display Co., Ltd., Seoul (KR)

(72) Inventors: JaeHee Park, Paju-si (KR); Jonghyeok Im, Paju-si (KR); Kihyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 102 days.

(21) Appl. No.: 17/977,899

(22) Filed: Oct. 31, 2022

(65) Prior Publication Data
US 2023/0200180 A1 Jun. 22, 2023

(30) Foreign Application Priority Data
Dec. 17, 2021 (KR) .......................... 10-2021-0181824

(51) Int. Cl.
*G09G 3/32* (2016.01)
*G06F 3/041* (2006.01)
(Continued)

(52) U.S. Cl.
CPC ......... *H10K 59/40* (2023.02); *G06F 3/04164* (2019.05); *G06F 3/0446* (2019.05);
(Continued)

(58) Field of Classification Search
CPC .... H10K 59/40; H10K 59/131; H10K 59/351; H10K 59/353; H10K 59/1213; H10K 59/1216; H10K 59/35; H10K 50/80; H10K 59/00; G06F 3/04164; G06F 3/0446; G06F 3/0412; G06F 3/0445; G06F 3/0418; G06F 3/044; H01L 27/124; H01L 27/156; G09G 3/32; G09G 2300/0426; G09G 2300/0809;
(Continued)

(56) References Cited

U.S. PATENT DOCUMENTS

| 10,481,743 B2 | 11/2019 | Choi et al. |
| 11,296,156 B2 | 4/2022 | Kim et al. |

(Continued)

FOREIGN PATENT DOCUMENTS

| CN | 108874231 A | 11/2018 |
| JP | 2019121231 A | 7/2019 |

(Continued)

*Primary Examiner* — Pegeman Karimi
(74) *Attorney, Agent, or Firm* — Seed IP Law Group LLP

(57) ABSTRACT

A transparent display device is provided, which may reduce or minimize loss of light transmittance due to a touch sensor and a touch line, and may detect a defective touch sensor in a touch block. The transparent display device with a touch sensor comprises a plurality of transmissive areas and a non-transmissive area disposed between the transmissive areas adjacent to each other, a plurality of pixels provided in the non-transmissive area, including a plurality of subpixels, a touch block including a plurality of touch sensors disposed in the plurality of transmissive areas, a plurality of touch connection portions respectively connected to the plurality of touch sensors, transferring a touch sensing voltage to the connected touch sensor and including a first high resistance area, and a plurality of sensing transistors respectively connected to the plurality of touch sensors, sensing a voltage of the connected touch sensor.

28 Claims, 24 Drawing Sheets

(51) Int. Cl.
    *G06F 3/044*         (2006.01)
    *H10K 59/131*      (2023.01)
    *H10K 59/35*       (2023.01)
    *H10K 59/40*       (2023.01)

(52) U.S. Cl.
    CPC ......... *H10K 59/131* (2023.02); *H10K 59/351* (2023.02); *H10K 59/353* (2023.02)

(58) Field of Classification Search
    CPC ... G09G 2310/0243; G09G 2310/0267; G09G 2300/0852; G09G 2310/0251; G09G 2310/0262; G09G 2340/0407; G09G 3/3233; G09F 9/33; G09F 9/35
    See application file for complete search history.

(56) References Cited

U.S. PATENT DOCUMENTS

| | | | |
|---|---|---|---|
| 2018/0120994 A1 | 5/2018 | Yoo et al. | |
| 2018/0275795 A1* | 9/2018 | Takahashi | G06F 3/0447 |
| 2018/0275821 A1* | 9/2018 | Ellis | G06F 3/0412 |
| 2019/0012512 A1* | 1/2019 | He | G06V 40/1324 |
| 2019/0212864 A1* | 7/2019 | Sugita | G06F 3/0412 |
| 2020/0020747 A1 | 1/2020 | Bok et al. | |
| 2021/0242284 A1* | 8/2021 | Kim | G06F 3/0445 |
| 2023/0354669 A1* | 11/2023 | Zhang | G06F 3/0412 |

FOREIGN PATENT DOCUMENTS

| | | |
|---|---|---|
| JP | 2020087935 A | 6/2020 |
| KR | 20170010674 A | 2/2017 |
| TW | 201837681 A | 10/2018 |
| WO | WO 2019013119 A1 | 1/2019 |

\* cited by examiner

TRANSPARENT DISPLAY DEVICE WITH TOUCH SENSOR

BACKGROUND

Technical Field

The present disclosure relates to a transparent display device with a touch sensor.

Description of the Related Art

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

A transparent display device may be provided with a plurality of touch sensors and a plurality of touch lines to implement a touch function.

BRIEF SUMMARY

The transparent display device in the related art, however has problems in that it is not easy to form the plurality of touch sensors and the plurality of touch lines or a process is complicated and light transmittance may be reduced due to the plurality of touch sensors and the plurality of touch lines.

One or more embodiments of the present disclosure address the various technical problems in the related art including the above identified problems.

One or more embodiments of the present disclosure provide a transparent display device that may reduce or minimize loss of light transmittance due to a touch sensor and a touch line.

One or more embodiments of the present disclosure provide a transparent display device that may detect a defective touch sensor among a plurality of touch sensors provided in a touch block.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by an example transparent display device with a touch sensor, comprising a plurality of transmissive areas and a non-transmissive area disposed between the transmissive areas adjacent to each other, a plurality of pixels provided in the non-transmissive area, including a plurality of subpixels, a touch block including a plurality of touch sensors disposed in the plurality of transmissive areas, a plurality of touch connection portions respectively connected to the plurality of touch sensors, transferring a touch sensing voltage to the connected touch sensor and including a first high resistance area, and a plurality of sensing transistors respectively connected to the plurality of touch sensors, sensing a voltage of the connected touch sensor.

In accordance with another aspect of the present disclosure, the above and other benefits can be accomplished by another example transparent display device with a touch sensor, comprising a substrate provided with a transmissive area and a non-transmissive area, a touch sensor provided in the transmissive area over the substrate, including a touch sensor electrode, a light emitting element provided in the non-transmissive area over the substrate, including an anode electrode, a light emitting layer and a cathode electrode, a sensing line detecting whether a short-circuit occurs between the cathode electrode and the touch sensor electrode, a sensing transistor connecting the touch sensor electrode of the touch sensor with the sensing line, and a scan line supplying a scan signal to the sensing transistor.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
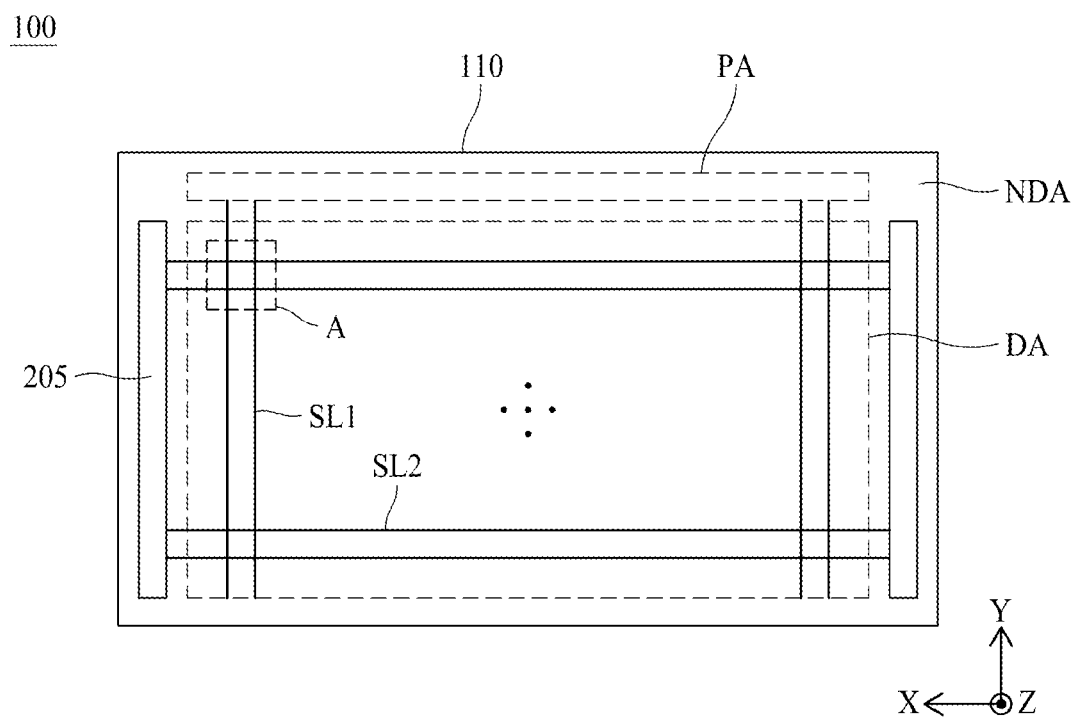
FIG. 1 is a schematic plan view illustrating a transparent display panel.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. A shape, a size, dimensions (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' ''below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a schematic plan view illustrating a transparent display panel.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, a transparent display device according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one scan driver 205.

The first signal lines SL1 may be extended in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 and the second signal line SL2 cross each other, and emits predetermined light to display an image.

The scan driver 205 are connected to the scan lines and supplies scan signals to the scan lines. The scan driver 205 may be disposed in the non-display area NDA on one side or both sides of the display area DA of the transparent display panel 110 by a gate driver in panel (GIP) method or a tape automated bonding (TAB) method.

The transparent display panel 110 may further include a touch line and a touch sensor in addition to the first signal line SL1, the second signal line SL2 and the pixel in order to implement a touch function. A detailed description of the touch line and the touch sensor will be described later with reference to FIGS. 2 to 23.

Figure 2:
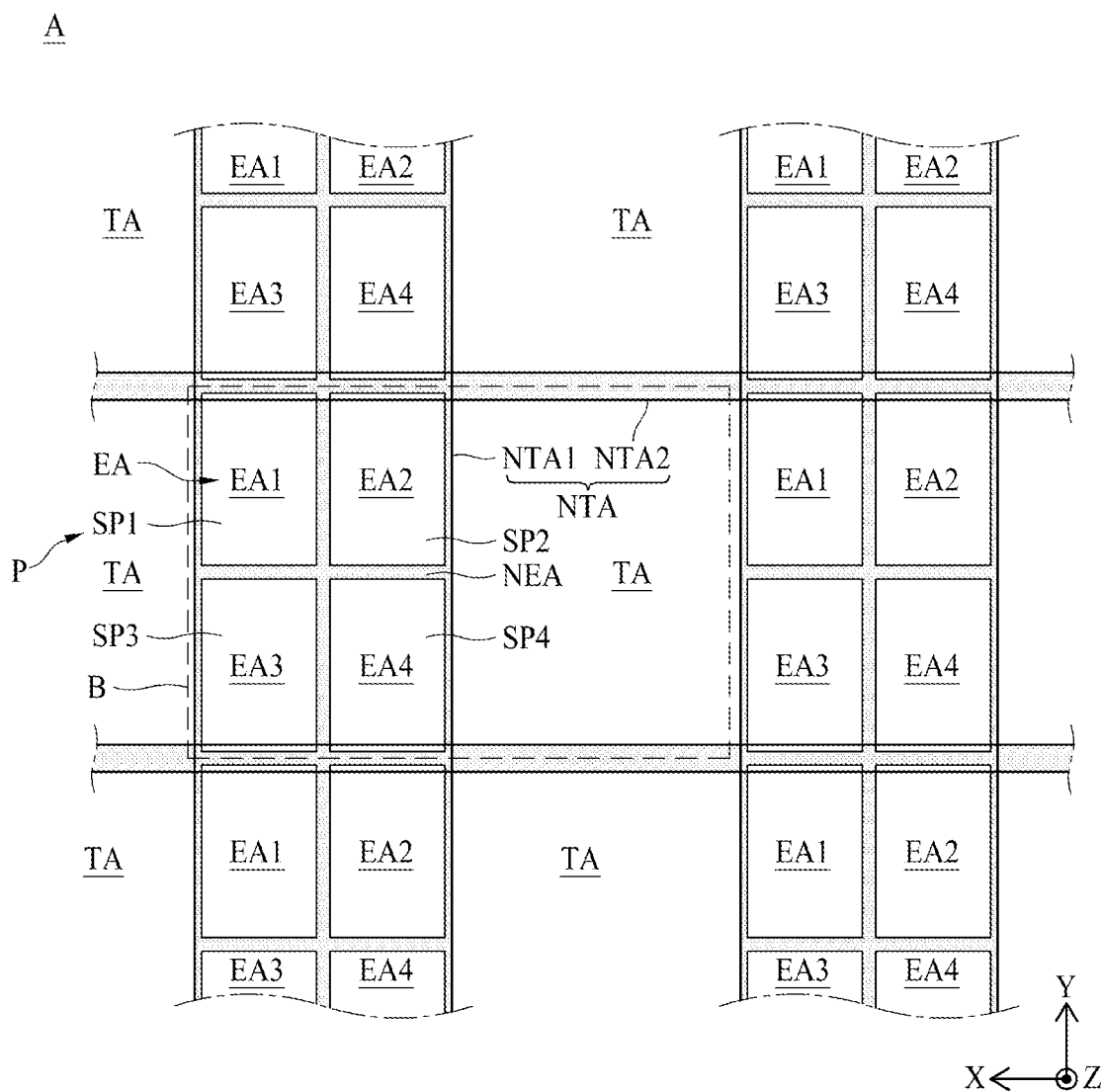
FIG. 2 is a schematic view illustrating an example of a pixel provided in an area A of FIG. 1.
Figure 3:
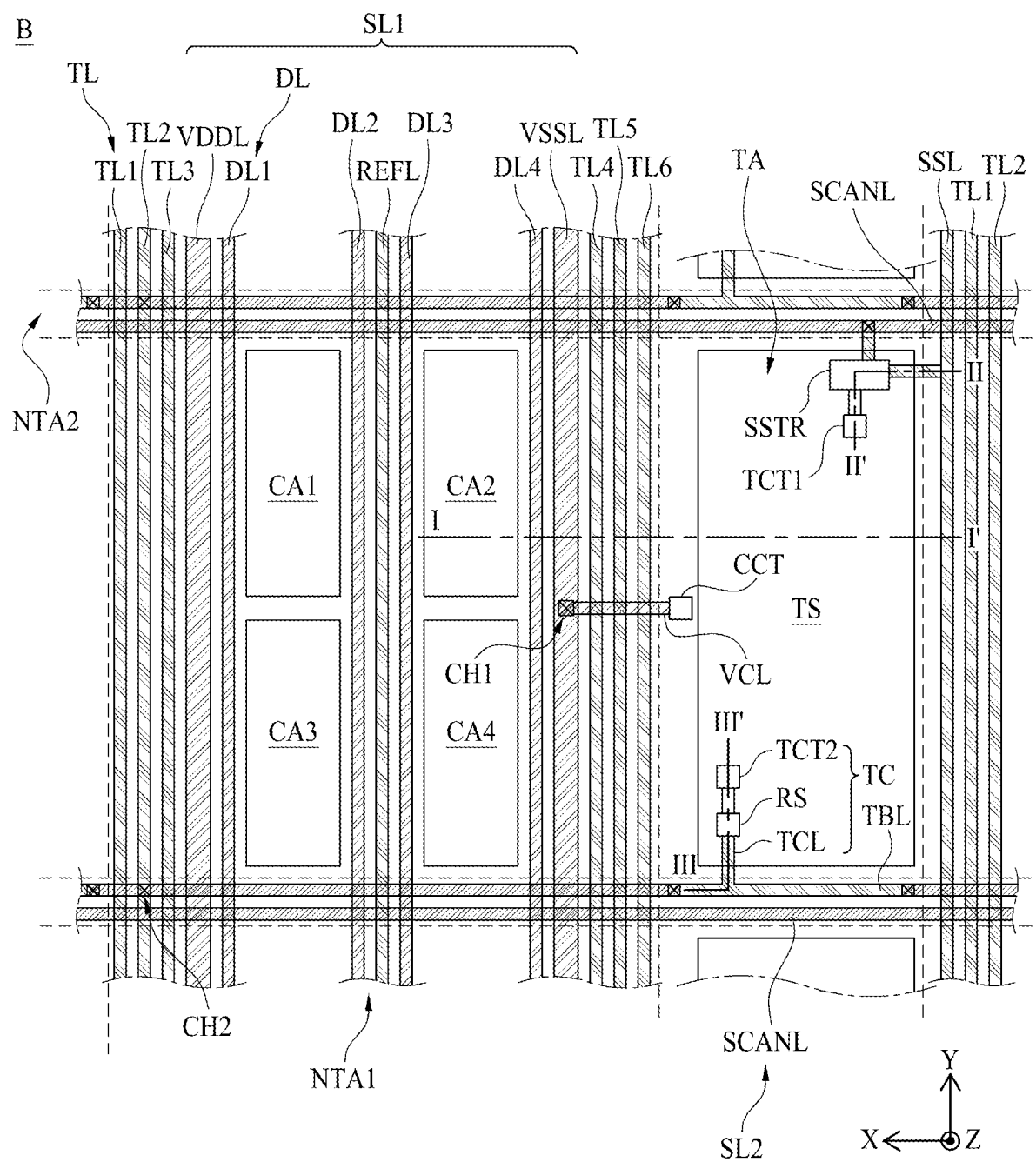
FIG. 3 is a view illustrating an example of signal lines, touch lines and a touch sensor, which are provided in an area B of FIG. 2.

FIG. 2 is a schematic view illustrating an example of a pixel provided in an area A of FIG. 1, and FIG. 3 is a view illustrating an example of signal lines, touch lines and a touch sensor, which are provided in an area B of FIG. 2.

The display area DA, as shown in FIG. 2, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P. Pixels P may be provided in the first non-transmissive area NTA1 or in an overlapping area where the first non-transmissive area NTA1 and a second non-transmissive area NTA2 overlap, and emit predetermined light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a green color. The second light emission area EA2 may emit light of a red color. The third light emission area EA3 may emit light of a blue color. The fourth light emission area EA4 may emit light of a white color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The first non-transmissive area NTA1 may be extended in a first direction (Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines SL1 extended in the first direction (Y-axis direction), touch lines TL extended in the first direction (Y-axis direction) and a sensing line SSL extended in the first direction (Y-axis direction) may be disposed to be spaced apart from each other.

For example, the first signal lines SL1 may include at least one of a pixel power line VDDL, a common power line VSSL, a reference line REFL or data lines DL1, DL2, DL3 and DL4.

The pixel power line VDDL may supply a first power source to a driving transistor DTR of each of subpixels SP1, SP2, SP3 and SP4 provided in the display area DA.

The common power line VSSL may supply a second power source to a cathode electrode of the subpixels SP1, SP2, SP3 and SP4 provided in the display area DA. At this time, the second power source may be a cathode power source. The cathode power source may be a common power source commonly supplied to the subpixels SP1, SP2, SP3 and SP4.

The common power line VSSL may supply the cathode power source to the cathode electrode through a cathode contact electrode CCT provided between the transmissive area TA and the common power line VSSL. A power connection line VCL may be disposed between the common power line VSSL and the cathode contact electrode CCT. One end of the power connection line VCL may be connected to the common power line VSSL through a first contact hole CH1 and the other end thereof may be connected to the cathode contact electrode CCT. The cathode electrode may be connected to the cathode contact electrode CCT. As a result, the cathode electrode may be electrically connected to the common power line VSSL through the power connection line VCL and the cathode contact electrode CCT.

The reference line REFL may supply an initialization voltage (or reference voltage) to the driving transistor DTR of each of the subpixels SP1, SP2, SP3 and SP4 provided in the display area DA. The reference line REFL may be disposed between the plurality of data lines DL1, DL2, DL3 and DL4. For example, the reference line REFL may be disposed at the center of the plurality of data lines DL1, DL2, DL3 and DL4, that is, between the second data line DL2 and the third data line DL3.

The reference line REFL may be diverged and connected to the plurality of subpixels SP1, SP2, SP3 and SP4. In detail, the reference line REFL may be connected to circuit elements of the plurality of subpixels SP1, SP2, SP3 and SP4 to supply an initialization voltage (or reference voltage) to each of the subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to a first driving transistor of the first subpixel SP1, the second data line DL2 may supply a second data voltage to a second driving transistor of the second subpixel SP2, the third data line DL3 may supply a third data voltage to a third driving transistor of the third subpixel SP3 and the fourth data line DL4 may supply a fourth data voltage to a fourth driving transistor of the fourth subpixel SP4.

In the transparent display panel 110 according to one embodiment of the present disclosure, the touch line TL may be further disposed in the first non-transmissive area NTA1. At least two touch lines TL may be provided in the first non-transmissive area NTA1. When the plurality of touch lines TL are disposed in the transmissive area TA of the transparent display panel 110, light transmittance may be deteriorated due to the plurality of touch lines TL.

Also, a slit, specifically an elongated linear or rectangular shape, may be provided between the plurality of touch lines TL. When external light passes through the slit, a diffraction phenomenon may occur. According to the diffraction phenomenon, light corresponding to plane waves may be changed to spherical waves as the light passes through the slit, and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced. For this reason, in some embodiments, the plurality of touch lines TL are preferably disposed in the first non-transmissive area NTA1 rather than the transmissive area TA.

A plurality of touch lines TL may be disposed between first signal lines SL1 in the first non-transmissive area NTA1 and a transmissive area TA as shown in FIG. 3. For example, six touch lines TL1, TL2, TL3, TL4, TL5 and TL6 may be disposed in one first non-transmissive area NTA1. Three TL1, TL2 and TL3 of the six touch lines TL1, TL2, TL3, TL4, TL5 and TL6 may be disposed between a pixel power line VDDL and the transmissive area TA, and the other three touch lines TL4, TL5 and TL6 may be disposed between a common power line VSSL and the transmissive area TA, but are not limited to this arrangement. The plurality of touch lines TL are disposed so as not to overlap circuit areas CA1, CA2, CA3 and CA4 in which circuit elements are disposed, and various modifications may be made in the arrangement order of the plurality of touch lines TL with the first signal lines SL1.

In the transparent display panel 110 according to one embodiment of the present disclosure, a sensing line SSL may be further disposed in the first non-transmissive area NTA1. The sensing line SSL is to detect whether short-circuit occurs between a cathode electrode of a light emitting element and a touch sensor electrode of a touch sensor TS, and may sense a voltage applied to the touch sensor electrode of a plurality of touch sensors TS through a sensing transistor SSTR.

The sensing line SSL may be disposed to be adjacent to the transmissive area TA in the first non-transmissive area NTA1. In detail, the sensing line SSL may be disposed between the plurality of touch lines TL and the transmissive area TA. The plurality of touch lines TL may be provided between the pixel power line VDDL and the transmissive area TA or between the common power line VSSL and the transmissive area TA. The plurality of touch lines TL may generate parasitic capacitance with the pixel power line VDDL or the common power line VSSL. The plurality of touch lines TL may have parasitic capacitance that is reduced as a spaced distance from the pixel power line VDDL or the common power line VSSL is increased, and may have parasitic capacitance that is increased as the spaced distance from the pixel power line VDDL or the common power line VSSL is reduced. For example, the parasitic capacitance of the first touch line TL1 may be smaller than that of the third touch line TL3. As a result, a parasitic capacitance deviation between the plurality of touch lines TL may be increased, and touch performance may be reduced.

In the transparent display panel 110 according to one embodiment of the present disclosure, the sensing line SSL may be disposed between the plurality of touch lines TL and the transmissive area TA, whereby the parasitic capacitance deviation between the plurality of touch lines TL may be reduced. The touch line TL, e.g., the first touch line TL1, which has the greatest spaced distance from the pixel power line VDDL or the common power line VSSL may have the smallest spaced distance from the sensing line SSL. Therefore, in the case of the first touch line TL1, the parasitic capacitance between the first touch line TL1 and the pixel power line VDDL or the common power line VSSL is the smallest, but the parasitic capacitance between the first touch line TL1 and the sensing line SSL may be the greatest. On the other hand, the touch line TL, e.g., the third touch line TL3, which has the smallest spaced distance from the pixel power line VDDL or the common power line VSSL may have the greatest spaced distance from the sensing line SSL. Therefore, in the case of the third touch line TL3, the parasitic capacitance between the third touch line TL3 and the pixel power line VDDL or the common power line VSSL may be the greatest, but the parasitic capacitance between the third touch line TL3 and the sensing line SSL may be smallest. As a result, the parasitic capacitance deviation between the plurality of touch lines TL may be reduced.

Although FIG. 3 illustrates that a separate sensing line SSL is provided in the transparent display panel 110, but the present disclosure is not limited thereto. In another embodiment, at least one of the pixel power line VDDL, the common power line VSSL, the reference line REFL and the data lines DL1, DL2, DL3 and DL4 may serve as a sensing line SSL.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4.

In a transparent display panel 110 according to one embodiment of the present disclosure, a plurality of touch lines TL do not overlap circuit areas CA1, CA2, CA3 and CA4, so that parasitic capacitance of the touch lines TL due to a circuit element may be reduced or minimized. At the same time the horizontal distance difference between the touch lines TL may be reduced to improve uniformity of parasitic capacitance.

The second non-transmissive area NTA2 may be extended in the display area DA in a second direction (X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2. The second signal line SL2 and a touch bridge line TBL may be disposed to be spaced apart from each other in the second non-transmissive area NTA2.

A second signal line SL2 may be extended in a second direction (X-axis direction), and may include, for example, a scan line SCANL. The scan line SCANL may supply a scan signal to the subpixels SP1, SP2, SP3 and SP4 of the pixel P.

A touch bridge line TBL may connect any one of the plurality of touch lines TL with a touch sensor TS. The touch bridge line TBL may be connected to any one of the plurality of touch lines TL through a second contact hole CH2. Also, the touch bridge line TBL may be connected to at least two touch sensors TS arranged in a second direction (X-axis direction) while being extended in the second direction (X-axis direction).

In the transparent display panel 110 according to one embodiment of the present disclosure, the plurality of touch lines TL may be disposed in a first non-transmissive area NTA1 not a second non-transmissive area NTA2, so that light transmittance may be prevented from being deteriorated due to the plurality of touch lines TL. The second non-transmissive area NTA2 extended in the second direction (X-axis direction) crosses between adjacent transmissive areas TA as shown in FIG. 3. When a width of the second non-transmissive area NTA2 crossing the transmissive areas TA is increased, a size of the transmissive area TA is necessarily reduced.

When the plurality of touch lines TL are disposed in the second non-transmissive area NTA2, the width of the second non-transmissive area NTA2 is increased to dispose a large number of lines, and the size of the transmissive area TA is reduced. That is, a problem may occur in that light transmittance of the transparent display panel 110 is reduced due to the plurality of touch lines TL.

In the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2. Therefore, the transparent display panel 110 according to one embodiment of the present disclosure may reduce or minimize the size decrease of the transmissive area TA or decrease in light transmittance due to the plurality of touch lines TL and the touch bridge line TBL.

The touch sensor TS may be provided in the transmissive area TA. The touch sensor TS may be disposed in each of the plurality of transmissive areas TA, and may be changed in capacitance during user contact. A touch driver (not shown) may be connected to the plurality of touch sensors TS through the plurality of touch lines TL to detect a change in capacitance of the plurality of touch sensors TS. The plurality of touch sensors TS may correspond to the plurality of pixels P one-to-one.

Hereinafter, a connection relation among a plurality of touch sensors TS, a plurality of touch lines TL and a plurality of touch bridge lines TBL will be described in more detail with reference to FIGS. 4 and 5.

Figure 4:
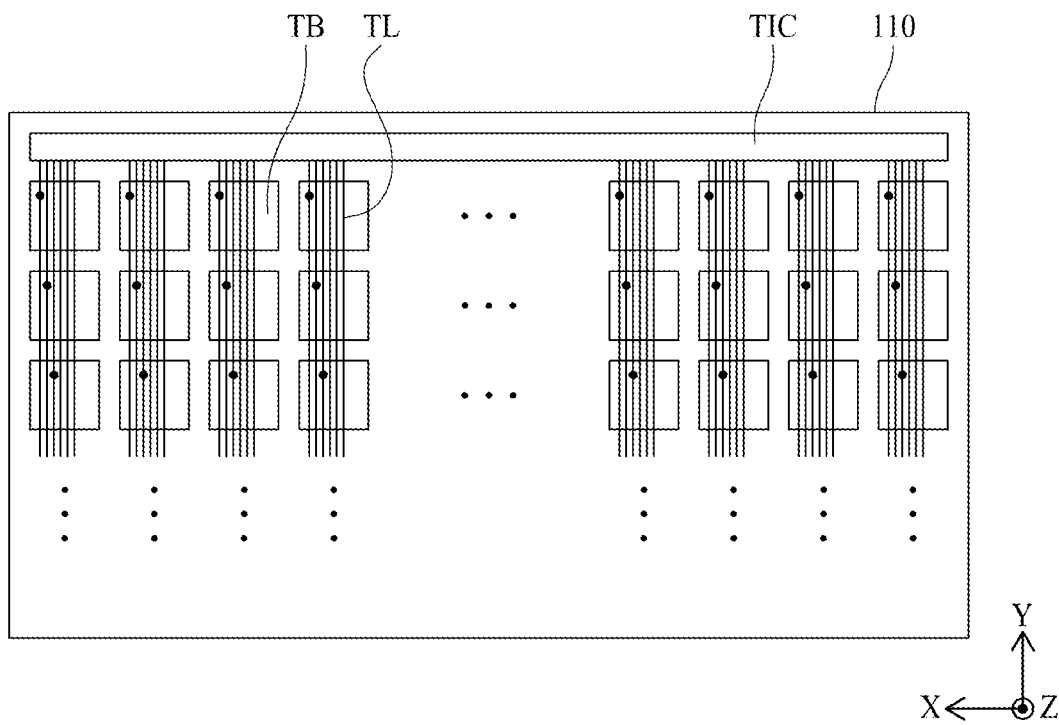
FIG. 4 is a view illustrating a connection relation between a plurality of touch blocks and a plurality of touch lines.
Figure 5:
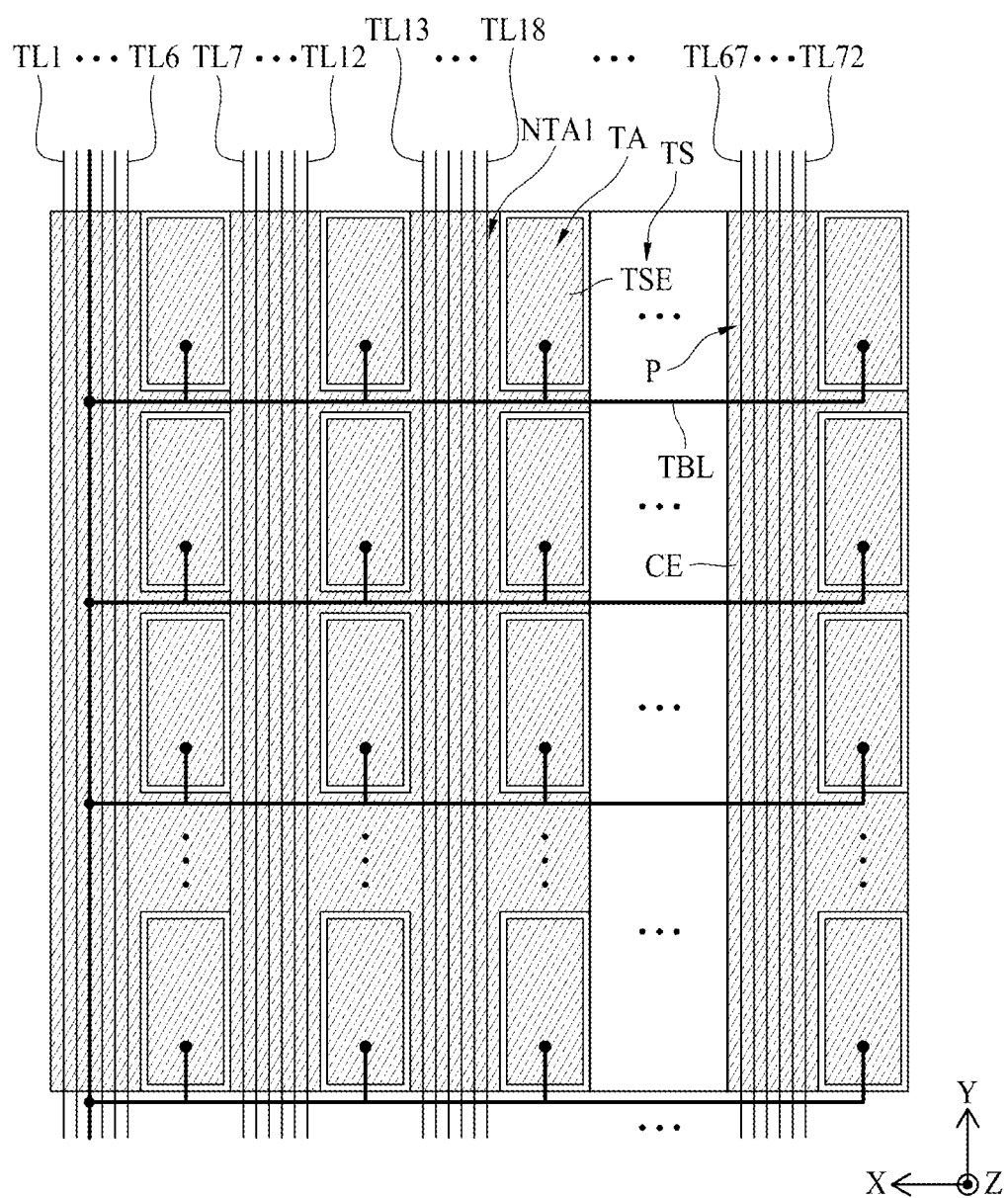
FIG. 5 is a view illustrating a connection relation between a plurality of touch lines and a plurality of touch sensors in one touch block.

FIG. 4 is a view illustrating a connection relation between a plurality of touch blocks and a plurality of touch lines, and FIG. 5 is a view illustrating a connection relation between a plurality of touch lines and a plurality of touch sensors in one touch block.

Referring to FIGS. 4 to 5, the transparent display panel 110 according to one embodiment of the present disclosure may include a plurality of touch blocks TB. Each of the plurality of touch blocks TB may include a plurality of pixels P and a plurality of transmissive areas TA disposed to correspond to the plurality of pixels P one-to-one as a basic unit for determining a user touch position. For example, each of the plurality of touch blocks TB may include 12×15 pixels P and 12×15 touch sensors TS. In this case, when image resolution is 1920×1080, touch resolution may be 160×72.

At this time, the touch sensor TS may include a touch sensor electrode TSE. The touch sensor electrode TSE may include the same material in the same layer as the cathode electrode CE of the pixel P. In this case, the touch sensor electrode TSE and the cathode electrode CE may be disposed to be spaced apart from each other.

In the transparent display panel 110 according to one embodiment of the present disclosure, as each of the plurality of touch lines TL is connected to one of the plurality of touch blocks TB, a change in capacitance of the touch sensors TS provided in the connected touch block TB may be sensed. That is, the plurality of touch lines TL provided in the transparent display panel 110 may correspond to the plurality of touch blocks TB one-to-one. Therefore, the number of touch lines TL may be the same as the number of touch blocks TB in the transparent display panel 110. For example, when the number of touch blocks TB is 160×72, the touch line TL may also be 160×72, and may be connected to the touch driver TIC.

As described above, in order to form the touch lines TL as much as the number of touch blocks TB, at least two touch lines TL should be provided in one first non-transmissive area NTA1. For example, when image resolution is 1920×1080 and touch resolution is 160×72, six touch lines TL1, TL2, TL3, TL4, TL5 and TL6 may be provided in one first non-transmissive area NTA1, as shown in FIG. 3, in order to form 160×72 touch lines TL in the transparent display panel 110.

The plurality of touch sensors TS provided in one touch block TB may be connected to one of the plurality of touch lines TL provided in one touch block TB as shown in FIG. 5. For example, twelve first non-transmissive areas NTA1 may be provided in one touch block TB, and six touch lines TL1, TL2, TL3, TL4, TL5 and TL6 may be disposed in each of the twelve first non-transmissive areas NTA1. As a result, one touch block TB may be provided with 72 touch lines TL1, . . . , TL72. In this case, the plurality of touch sensors TS provided in one touch block TB may be connected to one specific touch line TL of the 72 touch lines TL1, . . . , TL72. At this time, the specific touch line TL may be connected to the plurality of touch sensors TS arranged in the second direction (X-axis direction) through the touch bridge lines TBL extended in the second direction (X-axis direction). As a result, the plurality of touch sensors TS provided in one touch block TB may be electrically connected through a specific touch line TL and the touch bridge lines TBL.

Each of the plurality of touch lines TL may correspond to touch blocks TB one-to-one. Therefore, the plurality of touch blocks TB are connected to different touch lines and thus may be electrically separated from each other. Each touch line TL may connect a plurality of touch sensors TS provided in a corresponding touch block TB to a touch driver TIC. In detail, each touch line TL may transmit the changed capacitance provided from the touch sensors TS provided in the touch block TB to the touch driver TIC. The touch driver TIC may sense the changed capacitance, and may determine a touch position of a user. Also, each touch line TL may provide the sensing voltage generated from the touch driver TIC to the touch sensors TS provided in the touch block TB.

Hereinafter, light emitting elements of a light emission area EA and the touch sensors TS of the transmissive area TA will be described in more detail with reference to FIGS. 6 to 7.

Figure 6:
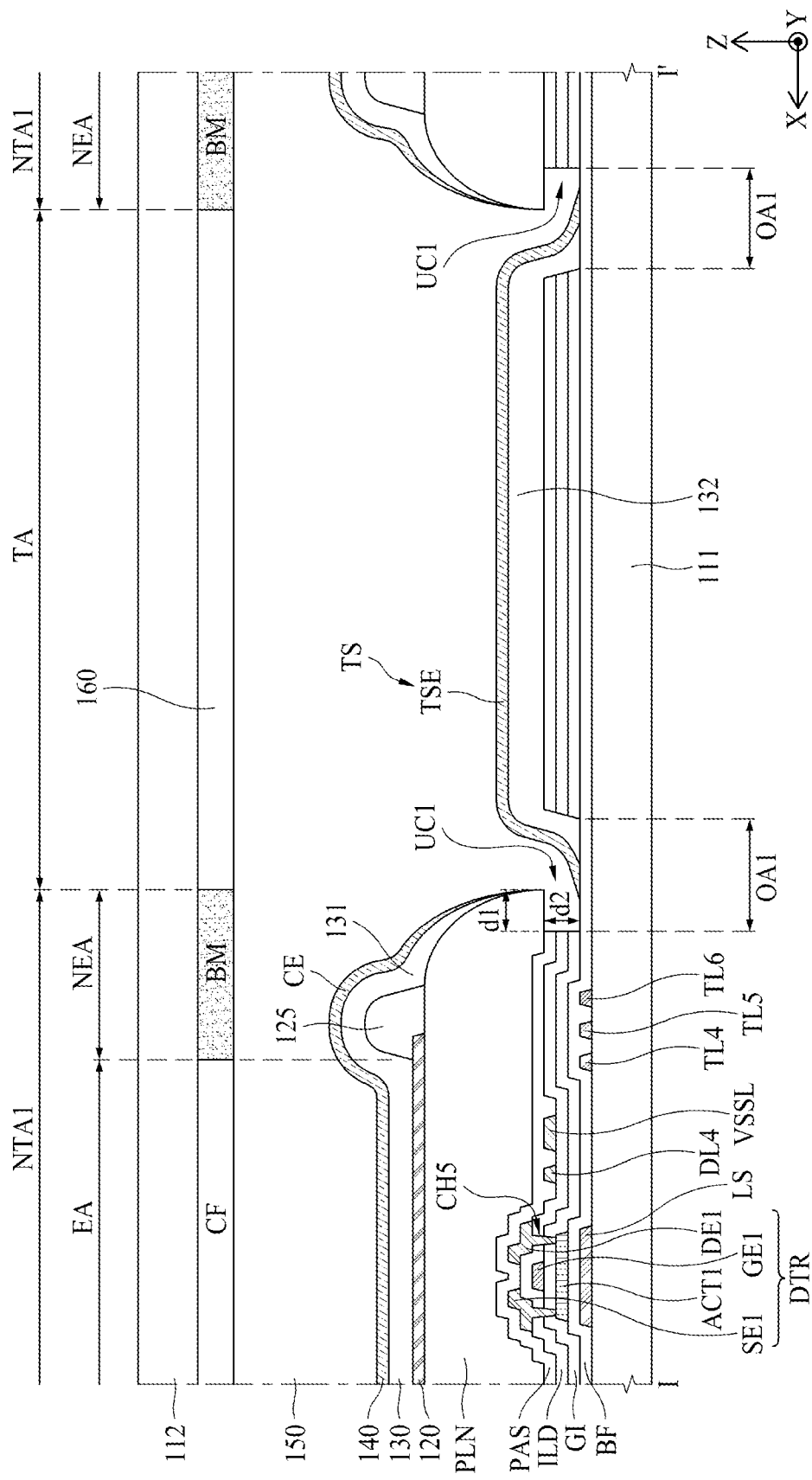
FIG. 6 is a cross-sectional view taken along line I-I' of FIG. 3.
Figure 7:
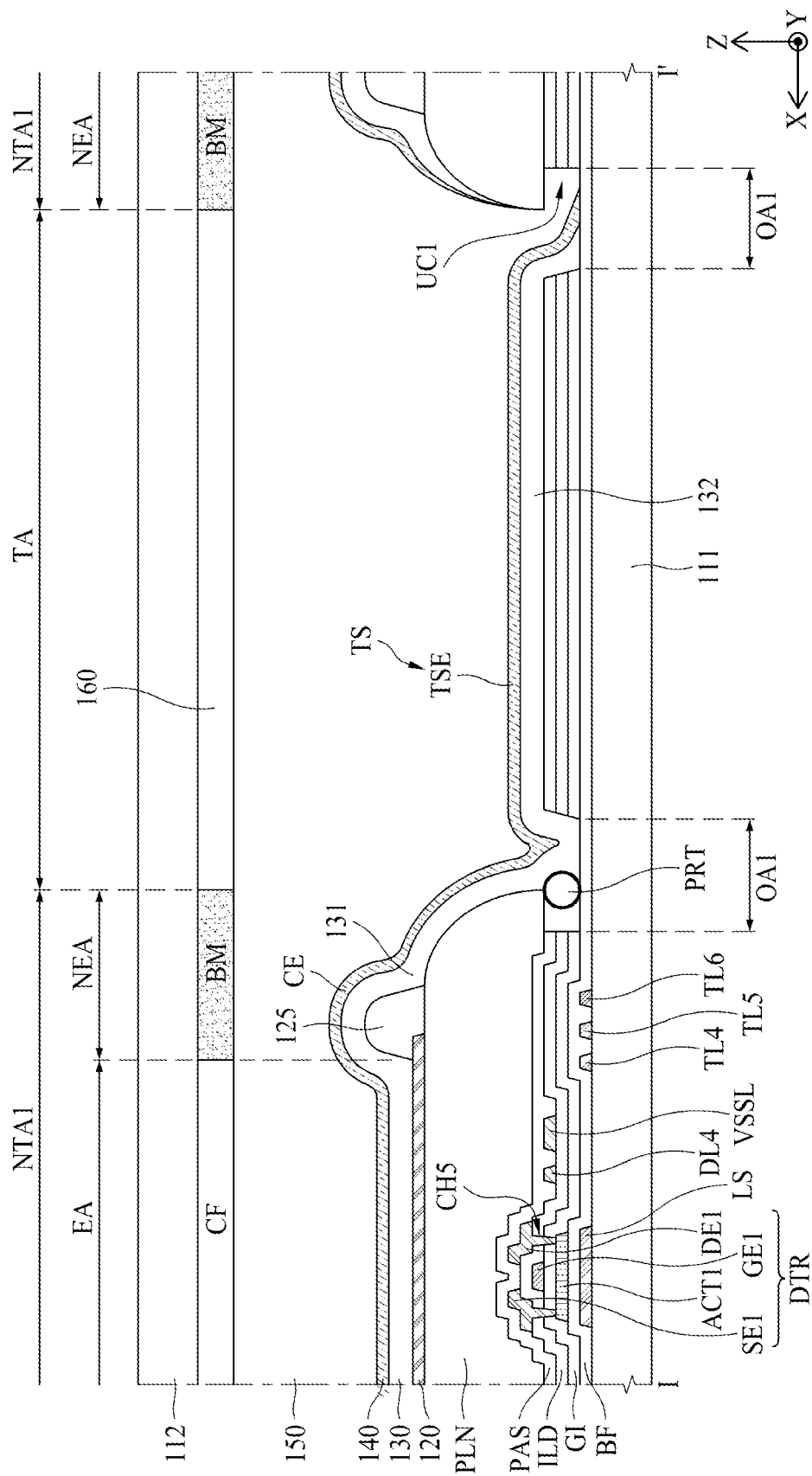
FIG. 7 is a view illustrating an example that a defective touch sensor occurs in a first undercut structure due to particles.

FIG. 6 is a cross-sectional view taken along line I-I' of FIG. 3, and FIG. 7 is a view illustrating an example that a defective touch sensor occurs in a first undercut structure due to particles PRT.

Referring to FIGS. 3, 6 and 7, a first substrate 111 of the transparent display panel 110 according to one embodiment of the present disclosure may include a plurality of transmissive areas TA, and a non-transmissive area NTA that includes a plurality of light emission areas EA disposed between the transmissive areas TA adjacent to each other. The non-transmissive area NTA may include a first non-transmissive area NTA1 extended in a first direction (Y-axis direction) and a second non-transmissive area NTA2 extended in a second direction (X-axis direction).

The first non-transmissive area NTA1 includes circuit areas CA1, CA2, CA3 and CA4 in which at least one transistor and a capacitor are disposed, and may be provided with a pixel power line VDDL, a common power line VSSL, a reference line REFL, data lines DL, touch lines TL and a sensing line SSL, which are extended in the first direction (Y-axis direction) and disposed so as not to overlap the circuit areas CA1, CA2, CA3 and CA4. The second non-transmissive area NTA2 may include a scan line SCANL and a touch bridge line TBL, which are extended in the second direction (X-axis direction).

At least one transistor may include a driving transistor DTR and switching transistors. The switching transistor may be switched in accordance with a scan signal supplied to the scan line SCANL to charge a data voltage supplied from the data line DL in the capacitor.

The driving transistor DTR is switched in accordance with the data voltage charged in the capacitor to generate a data current from a power source supplied from the pixel power line VDDL and supply the data current to a first electrode 120 of the subpixels SP1, SP2, SP3 and SP4. The driving transistor DTR may include an active layer ACT1, a gate electrode GE1, a source electrode SE1, and a drain electrode DE1.

As shown in FIG. 6, a light shielding layer LS may be provided over the first substrate 111. The light shielding layer LS may serve to shield external light incident on an active layer ACT1 in an area in which a driving transistor DTR is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

The transparent display panel 110 according to one embodiment of the present disclosure may form at least one of the pixel power line VDDL, the common power line VSSL, the reference line REFL, the data lines DL, the touch lines TL, the touch bridge line TBL and the sensing line SSL in the same layer as the light shielding layer LS. For example, the reference line REFL, the touch lines TL, the touch bridge line TBL and the sensing line SSL may include the same material as that of the light shielding layer LS and may be provided in the same layer as the light shielding layer LS, but are not limited thereto.

A buffer layer BF may be provided over the light shielding layer LS. The buffer layer BF is to protect the driving transistors DTR from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

An active layer ACT1 of the driving transistor DTR may be provided over the buffer layer BF. The active layer ACT1 may include a silicon-based semiconductor material or an oxide-based semiconductor material.

A gate insulating layer GI may be provided over the active layer ACT1 of the driving transistor DTR. The gate insulating layer GI may be provided in the non-transmissive area NTA and the transmissive area TA. However, in order to form the first undercut structure UC1 in the transmissive area TA, the gate insulating layer GI may be provided with a first opening area OA1 that is formed to expose the buffer layer BF without being provided in at least a portion of the transmissive area TA. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE1 of the driving transistor DTR may be provided over the gate insulating layer GI. The gate electrode GE1 may include a single layer or multi-layer made of one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE1 of the driving transistor DTR. The interlayer dielectric layer ILD may be provided in the non-transmissive area NTA and the transmissive area TA. However, the interlayer dielectric layer ILD may be provided with a first opening area OA1, which exposes the buffer layer BF without being provided in at least a portion of the transmissive area TA, to form a first undercut structure UC1 in the transmissive area TA. The interlayer dielectric layer ILD may include an inorganic layer, for example, a silicon oxide layer (SiOx), a silicon nitride layer (SiNx) or a multi-layer of the silicon oxide layer and the silicon nitride layer.

A source electrode SE1 and a drain electrode DE1 of the driving transistor DTR may be provided over the interlayer dielectric layer ILD. The source electrode SE1 and the drain electrode DE1 of the driving transistor DTR may be connected to the active layer ACT1 of the driving transistor DTR through a fifth contact hole CH5 passing through the gate insulating layer GI and the interlayer dielectric layer ILD. The source electrode SE1 and the drain electrode DE1 of the driving transistor DTR may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least one of the pixel power line VDDL, the common power line VSSL, the reference line REFL, the data lines DL, the touch lines TL, the touch bridge line TBL and the sensing line SSL may be provided in the same layer as the source electrode SE1 and the drain electrode DE1 of the driving transistor DTR. For example, the pixel power line VDDL, the common power line VSSL and the data lines DL may include the same material as that of the source electrode SE1 and the drain electrode DE1 in the same layer as the source electrode SE1 and the drain electrode DE1, but are not limited thereto.

The passivation layer PAS for insulating the driving transistor DTR may be provided over the source electrode SE1 and the drain electrode DE1 of the driving transistor DTR. The passivation layer PAS may be provided in the non-transmissive area NTA and the transmissive area TA. However, the passivation layer PAS may be provided with a first opening area OA1, which exposes the buffer layer BF without being provided in at least a portion of the transmissive area TA, to form the first undercut structure UC1 in the transmissive area TA. The first opening area OA1 of the passivation layer PAS may at least partially overlap the first opening area OA1 of the interlayer dielectric layer ILD and the first opening area OA1 of the gate insulating layer GI. The passivation layer PAS may include an inorganic layer, for example, a silicon oxide layer (SiOx), a silicon nitride layer (SiNx) or a multi-layer of the silicon oxide layer and the silicon nitride layer.

The planarization layer PLN may be provided over the passivation layer PAS to planarize a step difference due to the driving transistor DTR and the plurality of signal lines. The planarization layer PLN may be provided in the non-transmissive area NTA, and may not be provided in at least a portion of the transmissive area TA to form the first undercut structure UC1 in the transmissive area TA. The planarization layer PLN may include an organic layer such as an acrylic resin, an epoxy resin, a phenolic resin, a polyamide resin and a polyimide resin.

In the transparent display panel 110 according to one embodiment of the present disclosure, the first undercut structure UC1 may be formed using the planarization layer PLN and the plurality of inorganic insulating layers, for example, the passivation layer PAS, the interlayer dielectric layer ILD and the gate insulating layer GI. In detail, the first undercut structure UC1 may be formed in such a manner that the planarization layer PLN is more protruded than the plurality of inorganic insulating layers, for example, the passivation layer PAS, the interlayer dielectric layer ILD and the gate insulating layer GI in a direction of the transmissive area TA. Therefore, the first undercut structure UC1 may expose at least a portion of the lower surface of the planarization layer PLN, and the plurality of inorganic insulating layers may not be provided below the exposed lower surface so that a gap space with the buffer layer BF may be provided.

The first undercut structure UC1 may be formed through a wet etching process. The wet etching process for forming the first undercut structure UC1 may be isotropic etching in view of properties. Therefore, in the first undercut structure UC1, a first gap distance d1 from an end of the planarization layer PLN to an end of the plurality of inorganic insulating layers may be formed in the same manner as a second gap distance d2 from the lower surface of the planarization layer PLN to the upper surface of the buffer layer BF. At this time, the first gap distance d1 of the first undercut structure UC1 should have a minimum distance value, for example, 2 um or more in order to make sure of isolation between the cathode electrode CE and the touch sensor electrode TSE. Therefore, since the second gap distance d2 of the first undercut structure UC1 should be greater than or equal to 2 um, a sum of thicknesses of the passivation layer PAS, the interlayer insulating film ILD and the gate insulating film GI may be 2 um or more.

The first undercut structure UC1 is provided in the transmissive area TA, and may have a planar closed shape. For example, the first undercut structure UC1 may be provided along an edge of the transmissive area TA. At this time, the first undercut structure UC1 may be provided to surround the touch sensor TS.

In the transparent display panel 110 according to one embodiment of the present disclosure, the first undercut structure UC1 may be formed using the planarization layer PLN and the plurality of inorganic insulating layers, whereby light transmittance may be prevented from being reduced due to the first undercut structure UC1.

A light emitting element, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. The first electrode 120 is not provided in the transmissive area TA. The first electrode 120 may be connected to the driving transistor DTR. In detail, the first electrode 120 may be connected to one of the source electrode SE1 and the drain electrode DE1 of the driving transistor DTR through a contact hole (not shown) that passes through the planarization layer PLN and the passivation layer PAS.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode of the light emitting element.

The bank 125 may be provided over the planarization layer PLN. The bank 125 may be provided to at least partially cover an edge of the first electrode 120 and expose a portion of the first electrode 120. Therefore, the bank 125 may prevent a problem in which light emitting efficiency is deteriorated due to concentration of a current on an end of the first electrode 120.

The bank 125 may define light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode 120, the organic light emitting layer 130 and the cathode electrode CE are sequentially stacked and holes from the first electrode 120 and electrons from the cathode electrode CE are combined with each other in the organic light emitting layer 130 to emit light. In this case, the area in which the bank 125 is provided may become the non-light emission area NEA because light is not emitted therefrom, and the area in which the bank 125 is not provided and the first electrode 120 is exposed may become the light emission area EA.

The bank 125 may include an organic layer such as an acrylic resin, an epoxy resin, a phenolic resin, a polyamide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

An organic light emitting layer 130 may be separated from the non-transmissive area NTA and the transmissive area TA by the first undercut structure UC1. In detail, the organic light emitting layer 130 may be separated from an organic light emitting layer 131 provided in the non-transmissive area NTA and an organic light emitting layer 132 provided in the transmissive area TA by the first undercut structure UC1. That is, the organic light emitting layer 131 provided in the non-transmissive area NTA and the organic light emitting layer 132 provided in the transmissive area TA may be spaced apart from each other by the first undercut structure UC1.

A second electrode 140 may be disposed over the organic light emitting layer 130 and the bank 125. When the second electrode 140 is deposited on an entire surface, the second electrode 140 may be separated without being continuous between the non-transmissive area NTA and the transmissive area TA by the first undercut structure UC1. In detail, the second electrode 140 may be separated into a second electrode CE provided in the non-transmissive area NTA and a second electrode TSE provided in the transmissive area TA by the first undercut structure UC1.

In this case, the second electrode CE provided in the non-transmissive area NTA may be a cathode electrode CE, and is an element constituting a light emitting element. The cathode electrode CE may be connected to a cathode contact electrode CCT to receive a power source from the common power line VSSL. The cathode electrode CE may be a common layer that is commonly provided in the subpixels SP1, SP2, SP3 and SP4 to apply the same voltage.

Also, the second electrode TSE provided in the transmissive area TA is a touch sensor electrode TSE, and may be an element constituting the touch sensor TS. The touch sensor electrode TSE may be connected to a second touch contact electrode TCT2 to provide a change in capacitance to the touch line TL.

The second electrode 140, which includes the cathode electrode CE and the touch sensor electrode TSE, may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements and the touch sensors TS. The encapsulation layer 150 may be provided over the cathode electrode CE and the touch sensor electrode TSE to at least partially cover the cathode electrode CE and the touch sensor electrode TSE. The encapsulation layer 150 serves to prevent oxygen or water from being permeated into the organic light emitting layer 130, the cathode electrode CE and the touch sensor electrode TSE. Accordingly, in some embodiments, the encapsulation layer 150 may include at least one inorganic layer and at least one organic layer.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels SP1, SP2, SP3 and SP4. A black matrix BM may be provided between color filters CF. The black matrix BM may be disposed between the subpixels SP1, SP2, SP3 and SP4 to prevent a color mixture from occurring between adjacent subpixels SP1, SP2, SP3 and SP4. In addition, the black matrix BM may prevent light incident from the outside from being reflected by the plurality of lines, for example, the scan lines SCANL, the pixel power line VDDL, the common power line VSSL, the reference line REFL, data lines DL, etc., provided between the subpixels SP1, SP2, SP3 and SP4.

In the transparent display panel 110 according to one embodiment of the present disclosure, the touch sensor electrode TSE of the touch sensor TS and the cathode electrode CE of the light emitting element may be provided in the same layer using the first undercut structure UC1. In the transparent display panel 110 according to one embodiment of the present disclosure, a touch process is simplified, and a separate mask for the touch sensor electrode TSE is not required.

Also, in the transparent display panel 110 according to one embodiment of the present disclosure, the first undercut structure UC1 may be formed using the planarization layer PLN and the plurality of inorganic insulating layers, whereby the first undercut structure UC1 may be formed without loss of light transmittance.

Also, in the transparent display panel 110 according to one embodiment of the present disclosure, the touch lines TL may be disposed below the light emitting element, whereby light emitting efficiency of the pixel P may be prevented from being deteriorated due to the touch lines TL.

Also, in the transparent display panel 110 according to one embodiment of the present disclosure, the touch lines TL may be disposed so as not to overlap the circuit areas CA1, CA2, CA3 and CA4, whereby influence caused by the circuit element may be reduced or minimized and at the same time uniformity of parasitic capacitance may be improved.

Also, in the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2, whereby decrease in a size of the transmissive area TA or decrease in light transmittance due to the plurality of touch lines TL and the touch bridge line TBL may be reduced or minimized.

As described above, in the transparent display panel 110 according to one embodiment of the present disclosure, the touch sensor electrode TSE of the touch sensor TS and the cathode electrode CE of the light emitting element may be separated from each other by the first undercut structure UC1. However, in the manufacturing process, particles PRT may occur in the first undercut structure UC1 as shown in FIG. 7. In this case, the touch sensor electrode TSE of the touch sensor TS and the cathode electrode CE of the light emitting element may be electrically connected to each other without being separated from each other.

Since all of the touch sensors TS included in one touch block TB are electrically connected to one another, all the touch sensors TS included in the corresponding touch block TB are not normally operated even though a defect occurs only in one of the touch sensors TS. Therefore, as shown in FIG. 7, when the touch sensor electrode TSE of the touch sensor TS and the cathode electrode CE of the light emitting element are connected to each other to generate the defective touch sensor TS, a touch of a user is not sensed in the entire touch block TB in which the defective touch sensor TS is included. In this case, a plurality of defective touch sensors TS may be generated, and may be disposed on their respective touch blocks TB different from one another. In this case, all of the plurality of touch blocks TB in which the plurality of defective touch sensors TS are disposed may not sense the touch, and consequently, a touch defect rate of the transparent display panel 110 may be increased.

The transparent display panel 110 according to one embodiment of the present disclosure may include elements capable of specifying a line area in which the defective touch sensor TS of the plurality of touch sensors TS included in one touch block TB is included. In addition, in the transparent display panel 110 according to one embodiment of the present disclosure, the touch sensors TS included in the specified line area and the touch bridge line TBL may be electrically separated from each other through a repair process.

Hereinafter, the elements capable of specifying the line area in which the defective touch sensor TS is included will be described with reference to FIGS. 3 and 8 to 23, and a case that the line area in which the defective touch sensor TS is included is detected using the elements will be described.

Figure 8:
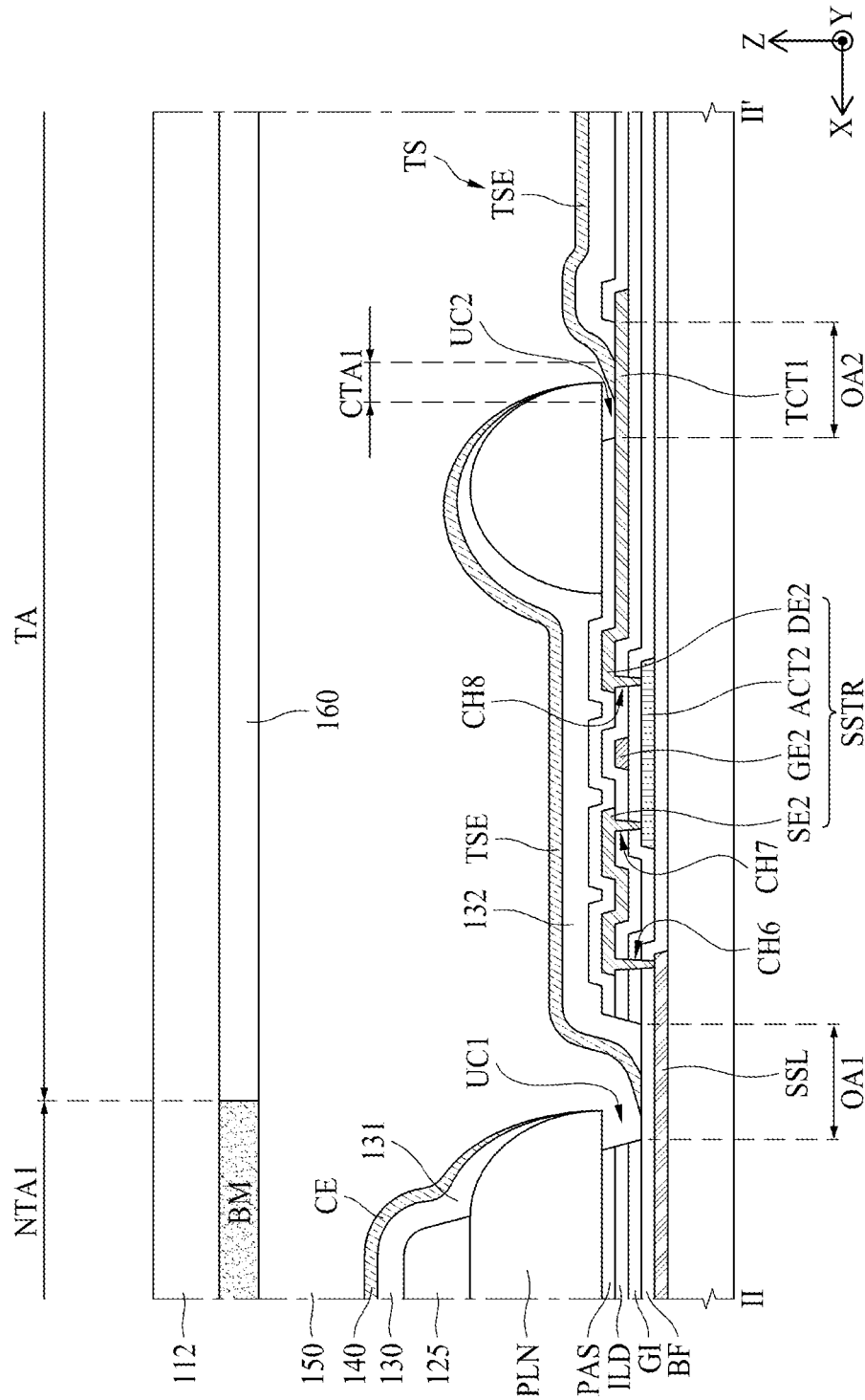
FIG. 8 is a cross-sectional view taken along line II-II' of FIG. 3.
Figure 9:
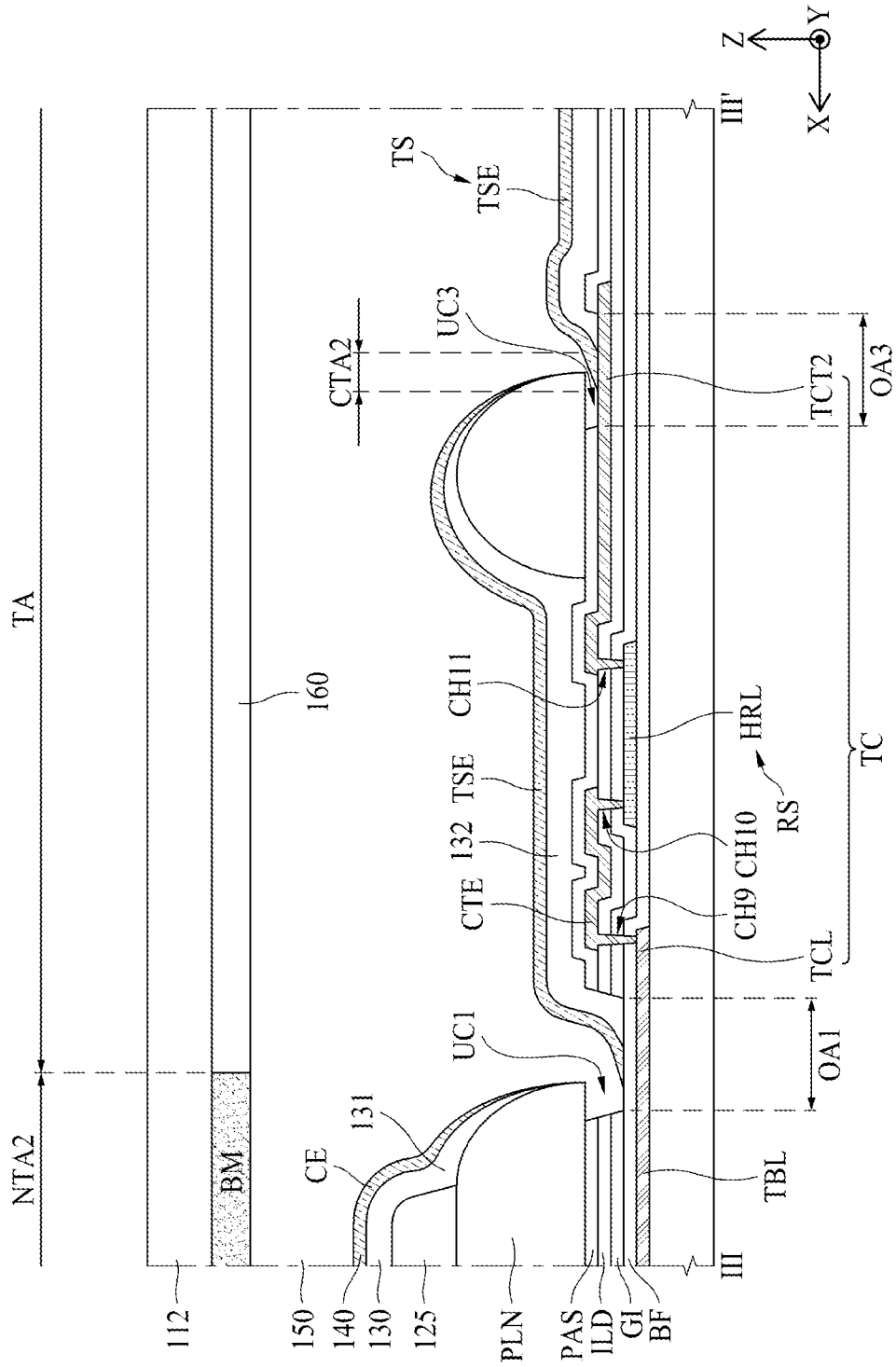
FIG. 9 is a cross-sectional view taken along line III-III' of FIG. 3.

FIG. 8 is a cross-sectional view taken along line II-II' of FIG. 3, and FIG. 9 is a cross-sectional view taken along line of III-III' FIG. 3.

Referring to FIGS. 3, 8 and 9, the transparent display panel 110 according to one embodiment of the present disclosure may further include a sensing transistor SSTR for connecting the touch sensor TS with the sensing line SSL, and a touch connection portion TC for connecting the touch sensor TS with the touch bridge line TBL, and may detect a defective touch sensor TS by using the sensing transistor SSTR and the touch connection portion TC. Also, in the transparent display panel 110 according to one embodiment of the present disclosure, when the defective touch sensor TS is detected, the touch connection portion TC for connecting the defective touch sensor TS with the touch bridge line TBL may be cut by a laser, so that the defective touch sensor TS and the touch bridge line TBL may be electrically separated from each other. As a result, the other touch sensors TS of the corresponding touch block TB may be normally operated.

Each of the plurality of sensing transistors SSTR may be connected to the touch sensor TS to transfer the voltage of the touch sensor TS to the sensing line SSL. In detail, the sensing transistor SSTR may be provided to at least partially overlap the touch sensor TS as shown in FIGS. 3 and 8, and thus may be connected to the touch sensor TS and the sensing line SSL. The sensing transistor SSTR may include an active layer ACT2, a gate electrode GE2, a source electrode SE2, and a drain electrode DE2. In FIGS. 3 and 8, the active layer ACT2, the gate electrode GE2, the source electrode SE2 and the drain electrode DE2 of the sensing transistor SSTR are illustrated as being all disposed to overlap the touch sensor electrode TSE, but are not limited thereto. In another embodiment, at least a portion of the drain electrode DE2 and the active layer ACT2 of the sensing transistor SSTR may overlap the touch sensor electrode TSE, and the gate electrode GE2 and the source electrode SE2 thereof may be provided between the touch sensor electrode TSE and the sensing line SSL.

The gate electrode GE2 of the sensing transistor SSTR may be connected to the scan line SCANL. The active layer ACT2 of the sensing transistor SSTR may be provided below the gate electrode GE2 to at least partially overlap the gate electrode GE2. The active layer ACT2 may be connected to the source electrode SE2 at one end through a seventh contact hole CH7, and may be connected to the drain electrode DE2 at the other end through an eighth contact hole CH8.

The source electrode SE2 of the sensing transistor SSTR may be connected to the sensing line SSL at one end through a sixth contact hole CH6, and may be connected to the active layer ACT2 at the other end through the seventh contact hole CH7. The drain electrode DE2 of the sensing transistor SSTR may be connected to the active layer ACT2 at one end through the eighth contact hole CH8, and may be in contact with a first touch contact electrode TCT1 at the other end. The drain electrode DE2 of the sensing transistor SSTR and the first touch contact electrode TCT1 may be formed in a single body.

The first touch contact electrode TCT1 may be provided in the transmissive area TA. The first touch contact electrode TCT1 may electrically connect the drain electrode DE2 with the touch sensor electrode TSE. A portion of an upper surface of the first touch contact electrode TCT1 may be exposed by a second undercut structure UC2, and the touch sensor electrode TSE may be connected to the exposed upper surface. In detail, the first touch contact electrode TCT1 may be formed in a layer provided between the buffer layer BF and the passivation layer PAS. In one embodiment, the first touch contact electrode TCT1 may be disposed between the interlayer dielectric layer ILD and the passivation layer PAS. In this case, the passivation layer PAS may be provided with a second opening area OA2 that is formed to expose at least a portion of the upper surface of the first touch contact electrode TCT1. The second undercut structure UC2 may be formed in such a manner that the planarization layer PLN is more protruded than the passivation layer PAS in the second opening area OA2 of the passivation layer PAS. Therefore, the second undercut structure UC2 may expose at least a portion of the lower surface of the planarization layer PLN, and may expose at least a portion of the upper surface of the first touch contact electrode TCT1 without having the passivation layer PAS below the exposed lower surface. The second undercut structure UC2 may be provided inside the area where the first undercut structure UC1 is provided. That is, the second undercut structure UC2 may be disposed in the area in which the touch sensor TS is provided.

The touch sensor electrode TSE may be deposited on the exposed upper surface of the first touch contact electrode TCT1 to form a first contact area CTA1, and may be electrically connected to the first touch contact electrode TCT1.

As described above, the gate electrode GE2 of the sensing transistor SSTR may be connected to the scan line SCANL and the source electrode SE2 thereof may be connected to the sensing line SSL. Further, the drain electrode DE2 of the sensing transistor SSTR may be connected to the touch sensor electrode TSE of the touch sensor TS. The sensing transistor SSTR may be turned on in response to the scan signal applied through the scan line SCANL. When the sensing transistor SSTR is turned on, a voltage of the touch sensor electrode TSE may be transferred to the sensing line SSL.

Meanwhile, each of the plurality of touch sensors TS may be connected to the touch bridge line TBL through the touch connection portion TC as shown in FIGS. 3 and 9. The touch connection portion TC may at least partially overlap the touch sensor TS at one end, and may at least partially overlap the touch bridge line TBL at the other end to connect the touch sensor TS with the touch bridge line TBL. The touch connection portion TC may include a touch connection line TCL, a resistance sensor RS including a first high resistance area, a connection electrode CTE, and a second touch contact electrode TCT2.

The touch connection line TCL may connect the touch bridge line TBL with the resistance sensor RS. In detail, one end of the touch connection line TCL may be connected to the touch bridge line TBL, and the other end thereof may be connected to the connection electrode CTE through a ninth contact hole CH9 and connected to the resistance sensor RS through the connection electrode CTE, but the present disclosure is not limited thereto. The touch connection line TCL may be directly connected to the resistance sensor RS.

The touch connection line TCL may be formed in a layer provided between the first substrate 111 and the driving transistor DTR. In one embodiment, the touch connection line TCL may include the same material as that of the light shielding layer LS in the same layer as the light shielding layer LS. Since the touch connection line TCL is extended from the touch bridge line TBL disposed in the second non-transmissive area NTA2 to the resistance sensor RS disposed in the transmissive area TA, the touch connection line TCL necessarily crosses the first undercut structure UC1. The first undercut structure UC1 may be formed through a wet etching process. In the transparent display panel 110 according to one embodiment of the present disclosure, the touch connection line TCL may be formed in the same layer as the light shielding layer LS so that the touch connection line TCL may be prevented from being lost in the wet etching process for forming the first undercut structure UC1.

The connection electrode CTE may electrically connect the touch connection line TCL with the resistance sensor RS. One end of the connection electrode CTE may be connected to the touch connection line TCL through the ninth contact hole CH9, and the other end thereof may be connected to the resistance sensor RS through a tenth contact hole CH10. In one embodiment, the connection electrode CTE may be disposed in the same layer as the source electrode SE1 and the drain electrode DE1 of the driving transistor DTR.

The resistance sensor RS may be disposed between the touch connection line TCL and the second touch contact electrode TCT2, and may include a high resistance line HRL. One end of the high resistance line HRL may be connected to the connection electrode CTE through the tenth contact hole CH10, and the other end thereof may be connected to the second touch contact electrode TCT2 through an eleventh contact hole CH11. Although FIG. 8 shows that the high resistance line HRL is connected to the touch connection line TCL through the connection electrode CTE, but the high resistance line HRL is not limited thereto. In another embodiment, the high resistance line HRL may be directly connected to the touch connection line TCL.

The high resistance line HRL may be made of a silicon-based semiconductor material or oxide-based semiconductor material to implement high resistance. For example, the high resistance line HRL may include the same material as that of an active layer ACT1 of the driving transistor DTR in the same layer as the active layer ACT1.

The second touch contact electrode TCT2 may be provided in the transmissive area TA. The second touch contact electrode TCT2 may be disposed between high resistance line HRL and the touch sensor electrode TSE to electrically connect the high resistance line HRL with the touch sensor electrode TSE. The second touch contact electrode TCT2 may be connected to the high resistance line HRL through the eleventh contact hole CH111.

At least a portion of an upper surface of the second touch contact electrode TCT2 may be exposed by a third undercut structure UC3, and the touch sensor electrode TSE may be connected to the exposed upper surface. In detail, the second touch contact electrode TCT2 may be formed in a layer provided between the buffer layer BF and the passivation layer PAS. In one embodiment, the second touch contact electrode TCT2 may be provided between the interlayer dielectric layer ILD and the passivation layer PAS. In this case, the passivation layer PAS may be provided with a third opening area OA3 that is formed to expose at least a portion of the upper surface of the second touch contact electrode TCT2. The third undercut structure UC3 may be formed in such a manner that the planarization layer PLN is more protruded than the passivation layer PAS in the third opening area OA3 of the passivation layer PAS. Therefore, the third undercut structure UC3 may expose at least a portion of the lower surface of the planarization layer PLN, and may expose at least a portion of the upper surface of the second touch contact electrode TCT2 without having the passivation layer PAS below the exposed lower surface. The third undercut structure UC3 may be provided inside the area in which the first undercut structure UC1 is formed. That is, the third undercut structure UC3 may be disposed in the area in which the touch sensor TS is provided.

The touch sensor electrode TSE may be deposited on the exposed upper surface of the second touch contact electrode TCT2 to form a second contact area CTA2, and may be electrically connected to the second touch contact electrode TCT2. The second touch contact electrode TCT2 may transfer a change in capacitance of the touch sensor electrode TSE to the touch line TL through the touch connection line TCL, the high resistance line HRL and the touch bridge line TBL.

Figure 10:
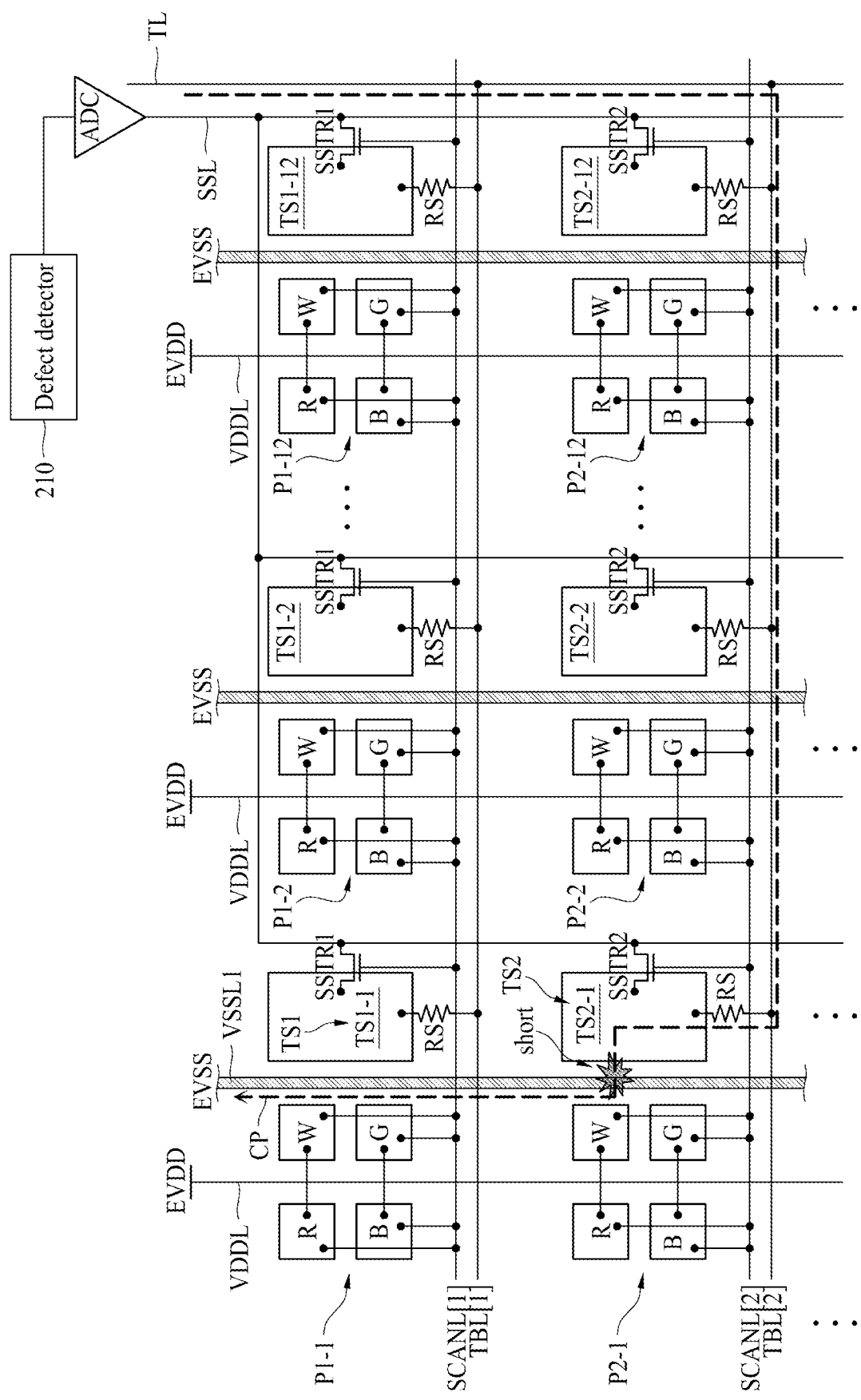
FIG. 10 is a view illustrating a current path when a defective touch sensor occurs.
Figure 11:
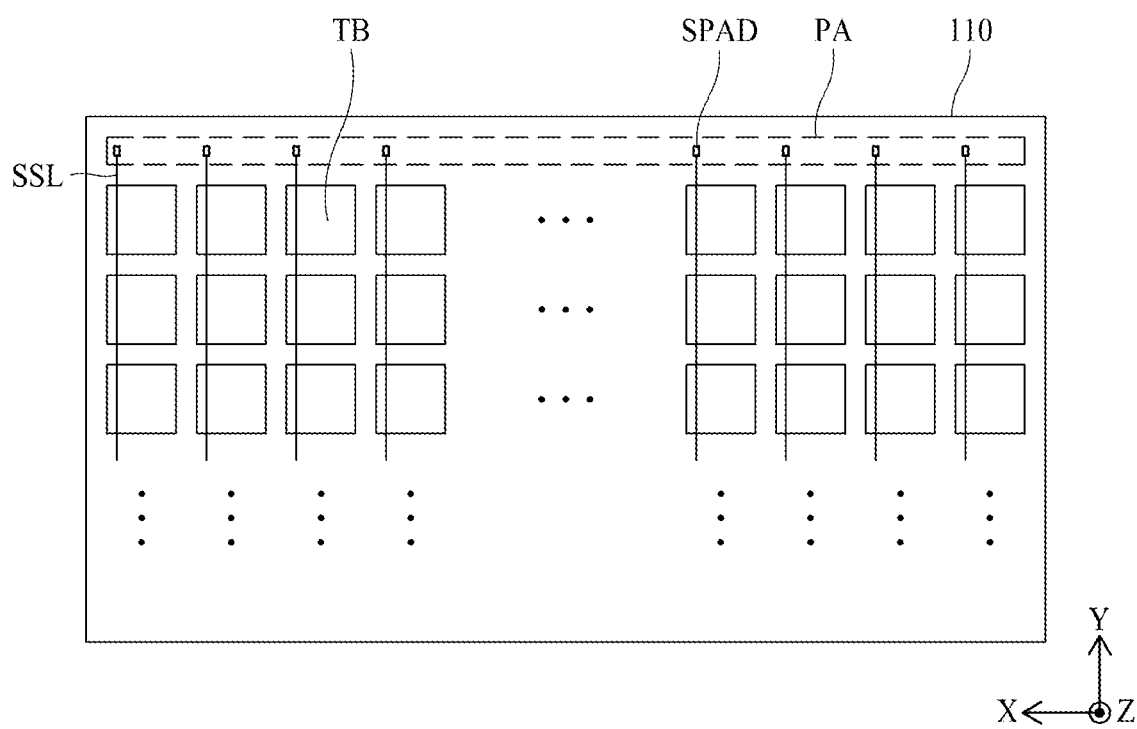
FIG. 11 is a view illustrating a sensing line disposed in a plurality of touch blocks.
Figure 12:
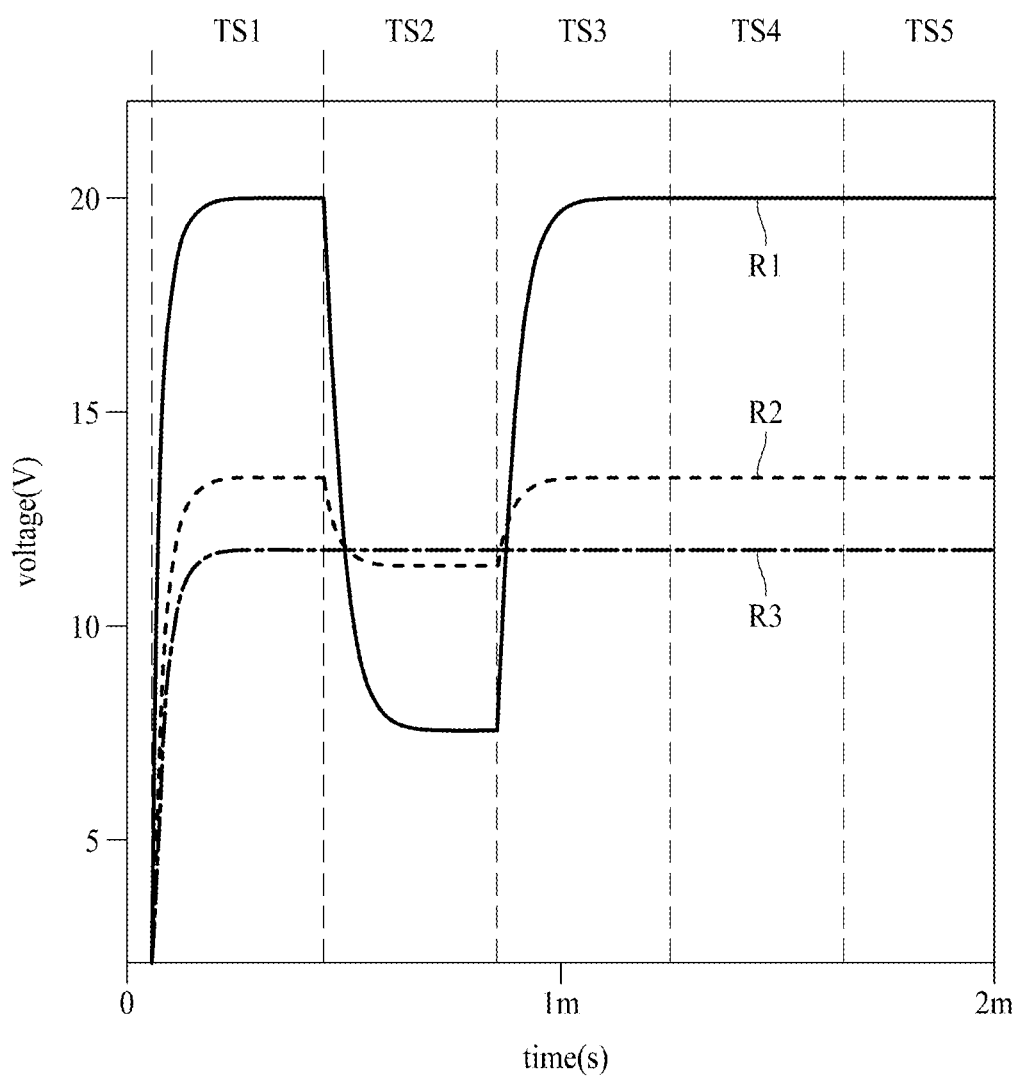
FIG. 12 is a view illustrating a voltage difference between a normal touch sensor and a defective touch sensor.

FIG. 10 is a view illustrating a current path when a defective touch sensor occurs, FIG. 11 is a view illustrating a sensing line disposed in a plurality of touch blocks, and FIG. 12 is a view illustrating a voltage difference between a normal touch sensor and a defective touch sensor.

Referring to FIGS. 10 to 12, in the transparent display panel 110 according to one embodiment of the present disclosure, the defective touch sensor TS may be detected using the sensing transistor SSTR and an electrical component such as the resistance sensor RS.

In detail, as described above, particles PRT may occur in the first undercut structure UC1, and the touch sensor electrode TSE of the touch sensor TS and the cathode electrode CE of the light emitting element may be electrically connected to each other without being separated from each other. In such a defective touch sensor TS2-1, when respective voltages different from each other are applied to the touch line TL and the common power line VSSL as shown in FIG. 10, a current flows from the touch sensor electrode TSE to the cathode electrode CE.

For example, a first voltage, e.g., 20V, may be applied to the touch line TL, and a second voltage, e.g., 0V, may be applied to the common power line VSSL. Since the touch sensor electrode TSE is electrically connected with the cathode electrode CE of the light emitting element, a current path CP may be generated from the touch sensor electrode TSE of the defective touch sensor TS2-1 to the cathode electrode CE. At this time, if the resistance sensor RS is provided on the current path CP, a voltage of the defective touch sensor TS2-1 is reduced by high resistance of the resistance sensor RS. Here, when a short circuit occurs at the defective touch sensor TS (e.g., short circuit occurring between the cathode electrode CE of the light emitting element and the touch sensor electrode TSE of the touch sensor), a current pass through the touch sensor electrode TSE, the electrical component (e.g., resistance sensor RS), the touch bridge line TBL[2], and the touch line TL. On the other hand, since no current flows to the touch sensor electrode TSE of a normal touch sensor TS1, the voltage applied from the touch line TL may be maintained in the normal touch sensor TS1.

The sensing transistors SSTR respectively connected to a plurality of touch sensors TS1 and TS2 may be sequentially turned on in accordance with scan signals applied through scan lines SCANL[1] and SCANL[2]. When the sensing transistor SSTR is turned on, the voltage of the touch sensor electrode TSE may be applied to an analog-to-digital (AD) converter ADC through the sensing line SSL.

At this time, the sensing line SSL may sense the voltages of the plurality of touch sensors TS for each line area. In detail, each of the plurality of touch blocks TB may be provided with one sensing line SSL as shown in FIG. 11. That is, one sensing line SSL may be disposed in one touch block TB, and the voltages of the touch sensors TS included in the corresponding touch block TB may be sensed through one sensing line SSL. The sensing line SSL provided in one touch block TB may be extended in the first direction (Y-axis direction) and connected to one sensing pad SPAD in a pad area PA.

Referring back to FIG. 10, since the plurality of sensing transistors SSTR are sequentially turned on in accordance with the scan signals applied through the scan lines SCANL[1] and SCANL[2], the sensing line SSL may sense the voltages of the plurality of touch sensors TS1 and TS2 for each scan line. For example, when the scan signal is applied to the first scan line SCANL[1], a first sensing transistor SSTR1 connected to the first scan line SCANL[1] may be turned on. When the first sensing transistor SSTR1 is turned on, the sensing line SSL may sense the voltages of the plurality of first touch sensors TS1 disposed in a line along the first scan line SCANL[1]. In detail, the sensing line SSL may sense an average voltage of the plurality of first touch sensors TS1. In this case, when the plurality of first touch sensors TS1 are all normal touch sensors, the average voltages of the plurality of first touch sensors TS1 may be equal to or similar to the first voltage applied to the touch line TL, for example, 20V.

When the scan signal is applied to the second scan line SCANL[2], a second sensing transistor SSTR2 connected to the second scan line SCANL[2] may be turned on. When the second sensing transistor SSTR2 is turned on, the sensing line SSL may sense voltages of the plurality of second touch sensors TS2 arranged in a line along the second scan line SCANL[2]. In detail, the sensing line SSL may sense an average voltage of the plurality of second touch sensors TS2. At this time, when the defective touch sensor TS2-1 is included in the plurality of second touch sensors TS2, since the voltage of the defective touch sensor TS2-1 is reduced by the high resistance of the resistance sensor RS, the average voltage of the plurality of second touch sensors TS2 may have a value that is reduced more greatly than the first voltage applied to the touch line TL, for example, 20V.

The AD converter (ADC) may convert the voltage of the touch sensor electrode TSE into digital sensing data and output the digital sensing data to a defect detector 210. In this case, the defect detector 210 may be an element included in an external circuit board (not shown), or may be an element included in an external defect inspection equipment.

The defect detector 210 may detect a first line area, in which the defective touch sensor TS2-1 is included, among a plurality of first line areas based on the voltages of the plurality of touch sensors TS. In this case, the first line area may represent an area in which the plurality of touch sensors TS are disposed in a line along the second direction (X-axis direction). Since the first line area is provided for each scan line, a plurality of first line areas may be provided.

A voltage of the first line area in which the defective touch sensor TS2-1 is included may be a voltage reduced from the first voltage applied to the touch line TL, for example, 20V, by line resistance of the touch line TL and the resistance sensor RS, and may be, for example, 8V. On the other hand, the voltage of the first line areas in which the defective touch sensor TS2-1 is not included may be the first voltage applied to the touch line TL, for example, 20V, or may be a voltage a little reduced by the line resistance of the touch line TL. The defect detector 210 may determine a first line area, in which a voltage sensed through the sensing line SSL is smaller than a reference value, as the first line area in which the defective touch sensor TS2-1 is included.

The transparent display panel 110 according to one embodiment of the present disclosure should include a first high resistance area to generate a voltage difference between the first line area in which the defective touch sensor TS2-1 is included and the first line area in which the defective touch sensor TS2-1 is not included. Referring to FIG. 12, when resistance is 0Ω (R3), since the voltage difference is not generated between the first line area in which the defective touch sensor TS2-1 is included and the first line area in which the defective touch sensor TS2-1 is not included, it is difficult to detect the first line area in which the defective touch sensor TS2-1 is included. Meanwhile, the voltage difference between the first line area in which the defective touch sensor TS2-1 is included and the first line area in which the defective touch sensor TS2-1 is not included may be increased as the resistance is increased. FIG. 12 shows the voltage between the first line area in which the defective touch sensor TS2-1 is included and the first line area in which the defective touch sensor TS2-1 is not included when the resistance is 1 kΩ (R2) and the resistance is 1 MΩ (R1). It is noted from FIG. 12 that the voltage difference between the first line area in which the defective touch sensor TS2-1 is included and the first line area in which the defective touch sensor TS2-1 is not included is greater in the case that the resistance R is 1 MΩ than the case that the resistance is 1 kΩ. That is, in the transparent display panel 110 according to one embodiment of the present disclosure, the first line area in which the defective touch sensor TS2-1 is included may be more easily detected as the resistance becomes high.

The resistance sensor RS may implement resistance of 1 kΩ or more by using the high resistance line HRL. However, in order to implement resistance of 1 MΩ, a length of the high resistance line HRL should be lengthened. Therefore, it is not easy to implement resistance of 1 MΩ by using the high resistance line HRL, and even though the resistance of 1 MΩ is implemented, light transmittance of the transmissive area TA may be reduced by the high resistance line HRL.

The transparent display panel 110 according to another embodiment of the present disclosure may apply a transistor instead of the resistance sensor RS to implement high resistance, for example, 1 MΩ.

Figure 13:
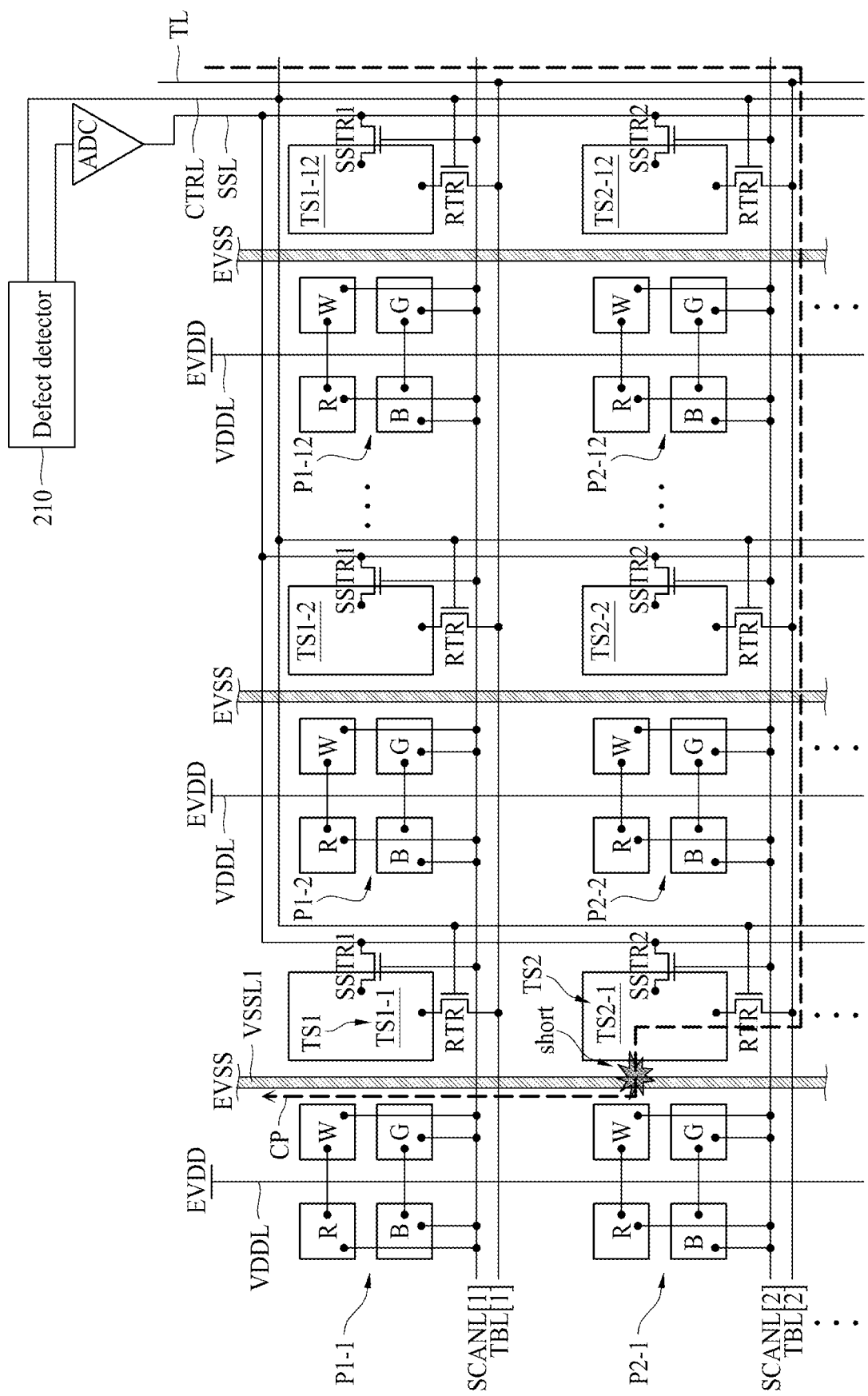
FIG. 13 is a view illustrating an example of a resistance transistor applied instead of a resistance sensor.

FIG. 13 is a view illustrating an example of a resistance transistor applied instead of a resistance sensor.

Referring to FIG. 13, the transparent display panel 110 according to another embodiment of the present disclosure may include another example of an electrical component such as a resistance transistor RTR between the touch bridge line TBL and the touch sensor TS. A gate electrode of the resistance transistor RTR may be connected to a separate control signal line CTRL, and a source electrode thereof may be connected to the touch bridge line TBL. Also, a drain electrode of the resistance transistor RTR may be connected to the touch sensor electrode TSE of the touch sensor TS. The resistance transistor RTR may be turned on or off in response to a control signal applied through the control signal line CTRL. The resistance transistor RTR may have the highest resistance in a turned-off state.

In the transparent display panel 110 according to another embodiment of the present disclosure, the resistance transistor RTR may be turned off after being turned on and then initialized. In the transparent display panel 110 according to another embodiment of the present disclosure, when the resistance transistor RTR is turned off, the voltages of the plurality of touch sensors TS may be sensed for each first line area (or scan line) through the sensing line SSL.

Figure 14:
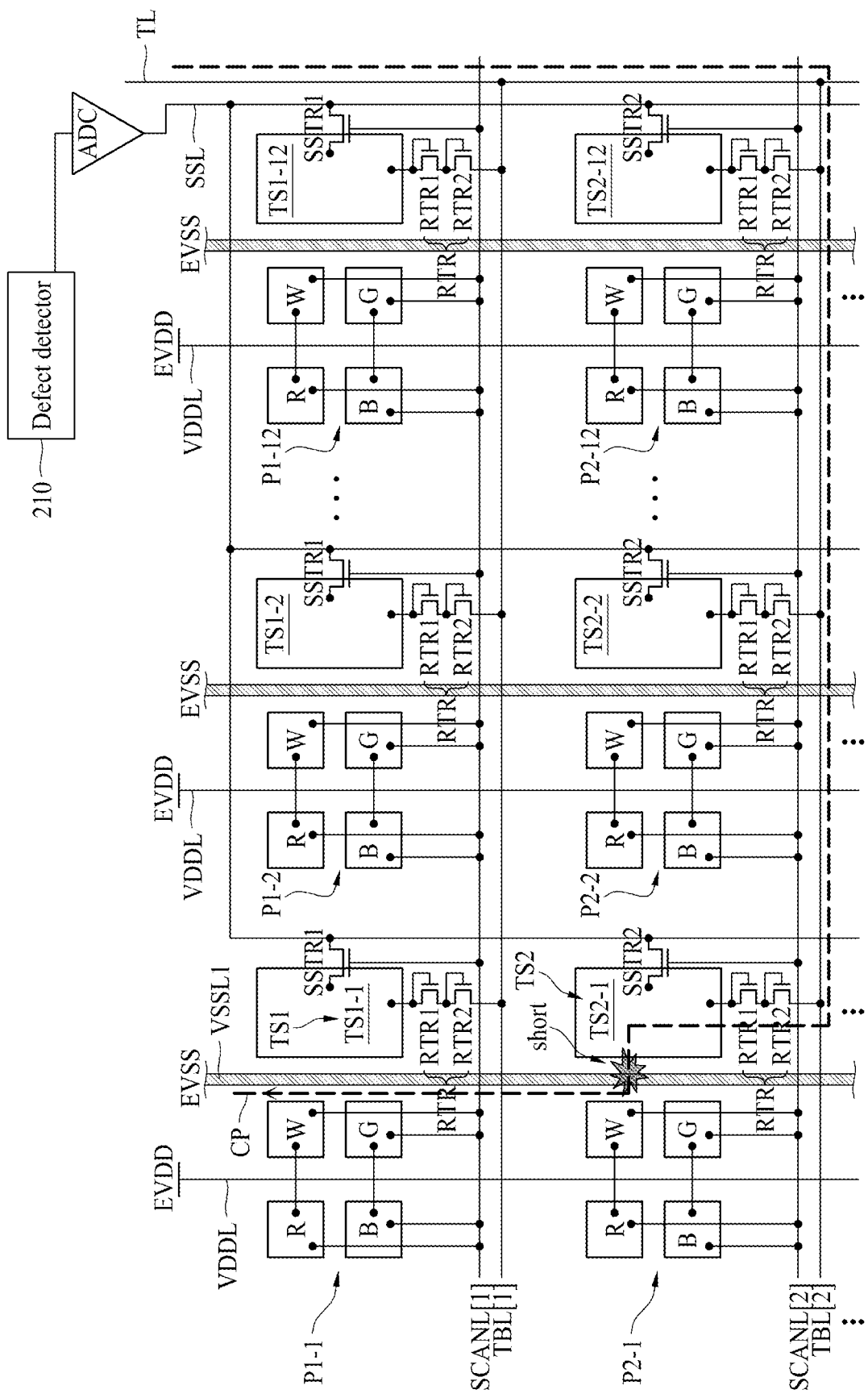
FIG. 14 is a view illustrating a modified embodiment of FIG. 13.

The transparent display panel 110 shown in FIG. 13 includes a separate control signal line CTRL for turning on or off the resistance transistor RTR, but is not limited thereto. FIG. 14 is a view illustrating a modified embodiment of FIG. 13.

Referring to FIG. 14, the transparent display panel 110 according to another embodiment of the present disclosure may include another example of an electrical component such as two resistance transistors RTR1 and RTR2 between the touch bridge line TBL and the touch sensor TS. Here, the first resistance transistor RTR1 and the second resistance transistor RTR2 are connected in series. A first electrode of the first resistance transistor RTR1, for example, a drain electrode, may be connected to the touch sensor electrode TSE of the touch sensor TS, and a second electrode thereof, for example, a source electrode, may be connected to the second resistance transistor RTR2. Further, a gate electrode of the first resistance transistor RTR1 may be connected to the first electrode. A first electrode of the second resistance transistor RTR2, for example, a drain electrode, may be connected to the first resistance transistor RTR1, and a second electrode thereof, for example, a source electrode, may be connected to the touch bridge line TBL. Further, a gate electrode of the second resistance transistor RTR2 may be connected to the first electrode.

The gate electrodes of the first and second resistance transistors RTR1 and RTR2 may be connected to the source electrode or the drain electrode to have high resistance without a separate control signal line CTRL in a turned-off state. Since the transparent display panel 110 that includes the first and second resistance transistors RTR1 and RTR2 as shown in FIG. 14 does not have to include a separate control signal line CTRL, the transmissive area TA may be widened to improve light transmittance as compared with the transparent display panel 110 that includes the resistance transistor RTR as shown in FIG. 13. Alternatively, the transparent display panel 110 that includes the first and second resistance transistors RTR1 and RTR2 as shown in FIG. 14 may increase the spaced distance between the signal lines, particularly the touch lines TL, thereby reducing parasitic capacitance of the touch lines TL.

The electrical component coupled between the touch sensor TS and the touch bridge line TBL has been described as being one of the following examples: a resistance sensor RS (see FIG. 10), a resistance transistor RTR (see FIG. 13), and a series resistance transistors RTR1, RTR2 (see FIG. 14). However, the electrical component is not limited to the above examples. A person of ordinary skill in the art would readily appreciate that there may be various other ways besides the examples shown in FIGS. 10, 13, and 14 to serve the purpose of sensing a defect such as a short circuit in a display device.

The transparent display panel 110 shown in FIGS. 3 to 9 is described that the sensing transistor SSTR is connected to the touch sensor electrode TSE through the first touch contact electrode TCT1 and the resistance sensor RS is connected to the touch sensor electrode TSE through the second touch contact electrode TCT2, but is not limited thereto. In another embodiment, the sensing transistor SSTR and the resistance sensor RS may be connected to the touch sensor electrode TSE through the same touch contact electrode.

Figure 15:
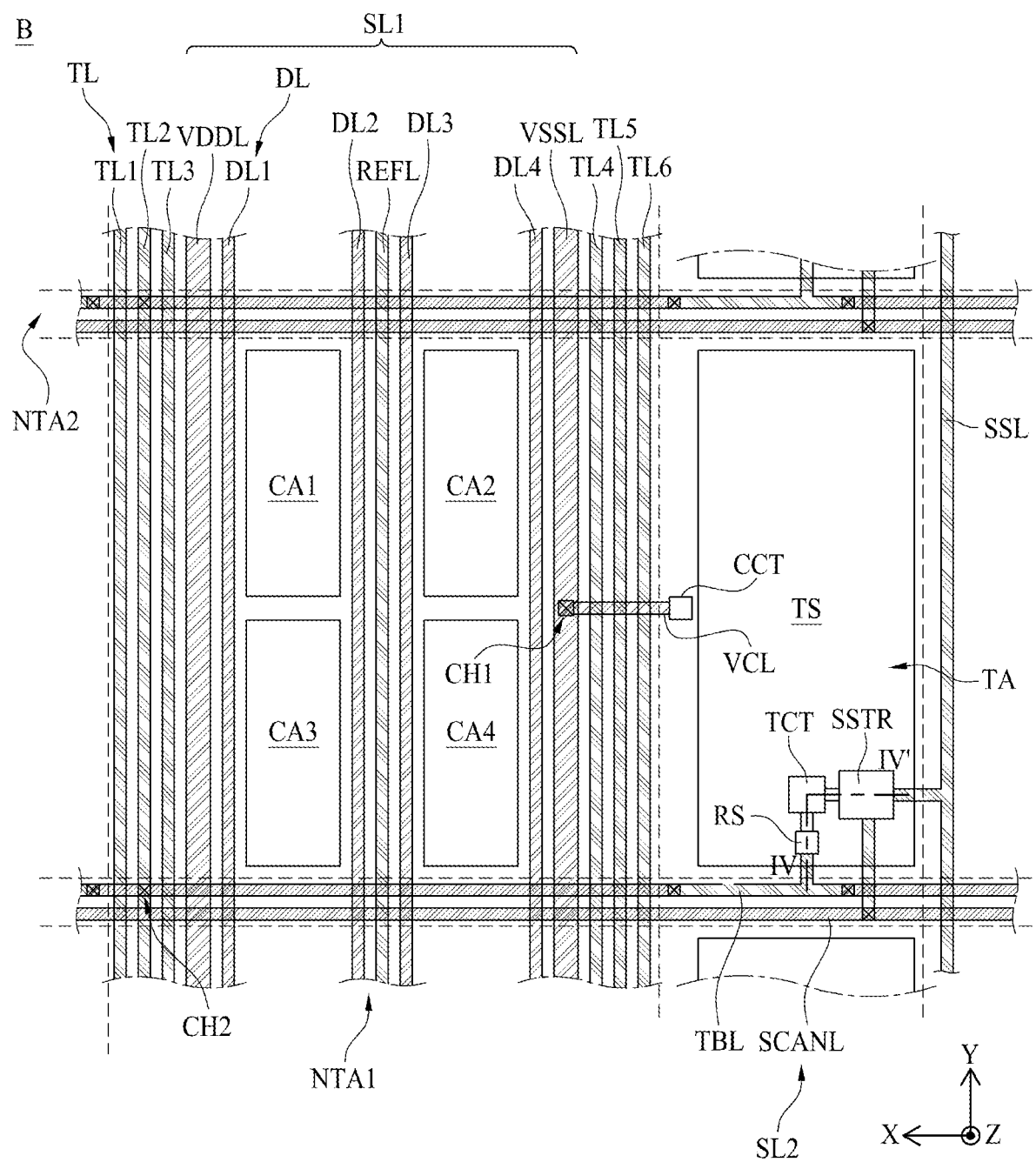
FIG. 15 is a view illustrating a modified embodiment of FIG. 3.
Figure 16:
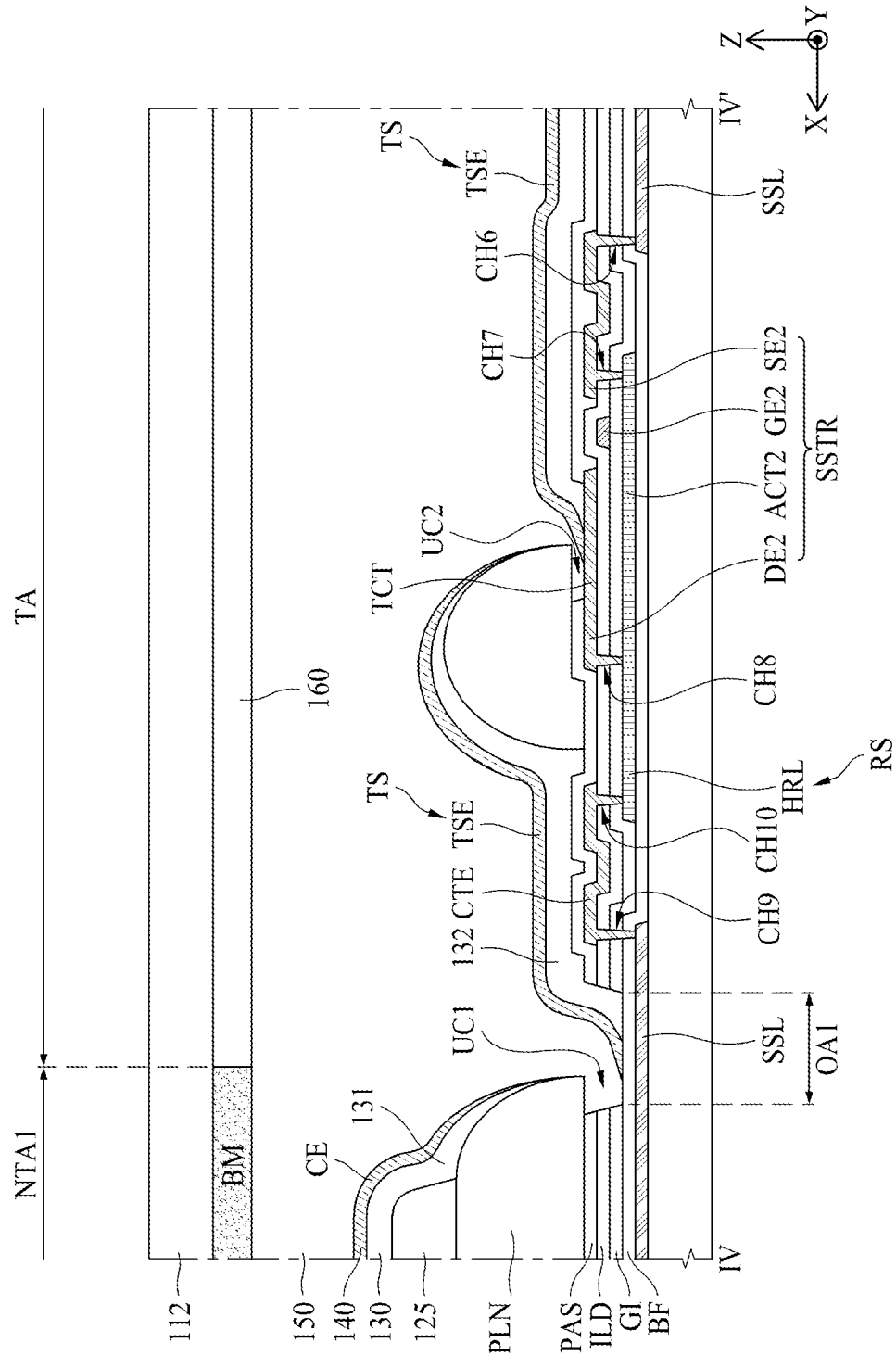
FIG. 16 is a cross-sectional view taken along line IV-IV' of FIG. 15.

FIG. 15 is a view illustrating a modified embodiment of FIG. 3. FIG. 16 is a cross-sectional view taken along line IV-IV' of FIG. 15.

Referring to FIGS. 15 and 16, in the transparent display panel 110 according to another embodiment of the present disclosure, the sensing transistor SSTR and the resistance sensor RS may be connected to the touch sensor electrode TSE through the same touch contact electrode TCT.

In detail, the resistance sensor RS may include a high resistance line HRL. The high resistance line HRL may be connected to the connection electrode CTE at one end through a tenth contact hole CH10, and may be in contact with the active layer ACT2 of the sensing transistor SSTR at the other end. At this time, the high resistance line HRL of the resistance sensor RS and the active layer ACT2 of the sensing transistor SSTR are formed in a single body so that a portion of the resistance sensor RS may be the high resistance line HRL of the resistance sensor RS, and the other portion of the resistance sensor RS may be the active layer ACT2 of the sensing transistor SSTR.

The sensing transistor SSTR may include an active layer ACT2, a gate electrode GE2, a source electrode SE2 and a drain electrode DE2. The active layer ACT2 of the sensing transistor SSTR may be connected to the source electrode SE2 at one end through the seventh contact hole CH7, and may be connected to the drain electrode DE2 at the other end through the eighth contact hole CH8. The active layer ACT2 of the sensing transistor SSTR may be in contact with the high resistance line HRL of the resistance sensor RS at the other end.

The source electrode SE2 of the sensing transistor SSTR may be connected to the sensing line SSL at one end through the sixth contact hole CH6, and may be connected to the active layer ACT2 at the other end through the seventh contact hole CH7. The drain electrode DE2 of the sensing transistor SSTR may be connected to the active layer ACT2 at one end through the eighth contact hole CH8, and may be in contact with the touch contact electrode TCT at the other end. The drain electrode DE2 of the sensing transistor SSTR and the touch contact electrode TCT may be formed in a single body.

The sensing transistor SSTR may be connected to the touch sensor electrode TSE through the drain electrode DE2 and the touch contact electrode TCT. In addition, the resistance sensor RS may be connected to the touch sensor electrode TSE through the active layer ACT2 and the drain electrode DE2 of the sensing transistor SSTR and the touch contact electrode TCT.

In the transparent display panel 110 according to another embodiment of the present disclosure, the sensing transistor SSTR and the resistance sensor RS may be connected to the touch sensor electrode TSE through one touch contact electrode TCT, whereby the number of touch contact electrodes TCT provided in one touch sensor TS may be reduced. Therefore, in the transparent display panel 110 according to another embodiment of the present disclosure, since an area of an electrode pattern provided in the transmissive area TA is reduced, light transmittance may be improved in the transmissive area TA.

As described above, in the transparent display panel 110 that includes the sensing transistor SSTR and the first high resistance area, the first line area in which the defective touch sensor is included may be detected in one touch block TB. The defect detector 210 of the transparent display panel 110 may detect the touch block TB, in which the defective touch sensor TS is included, by sensing the plurality of touch lines TL connected to the plurality of touch blocks TB one-to-one. One touch block TB may include a plurality of first line areas in which a plurality of touch sensors TS are disposed in a line in the second direction (X-axis direction) along the scan line SCANL. In the transparent display panel 110, the first line area, in which the defective touch sensor is included, among the plurality of first line areas may be detected using the sensing transistor SSTR and the first high resistance area. When the first line area, in which the defective touch sensor TS is included, is detected, the transparent display panel 110 may electrically separate the touch sensor TS from the touch bridge line TBL by laser cutting the touch connection portion TC connected to each of the touch sensors TS included in the detected first line area. As a result, the touch sensors TS included in the other first line areas of the corresponding touch block TB may be normally operated.

In the transparent display panel 110 shown in FIGS. 3 to 16, only the first line area in which the defective touch sensor TS is detected, but is not limited thereto. In another embodiment, in the transparent display panel 110, a second line area in which the defective touch sensor TS is included may be detected. In this case, the second line area may be an area in which the plurality of touch sensors TS are disposed in a line in the first direction (Y-axis direction) along the common power line VSSL. Since the second line area is provided for each common power line VSSL, the second line area may be provided as a plurality of line areas.

Hereinafter, the configuration of the transparent display panel 110 that may detect the second line area in which the defective touch sensor TS is included will be described with reference to FIGS. 17 to 23.

Figure 17:
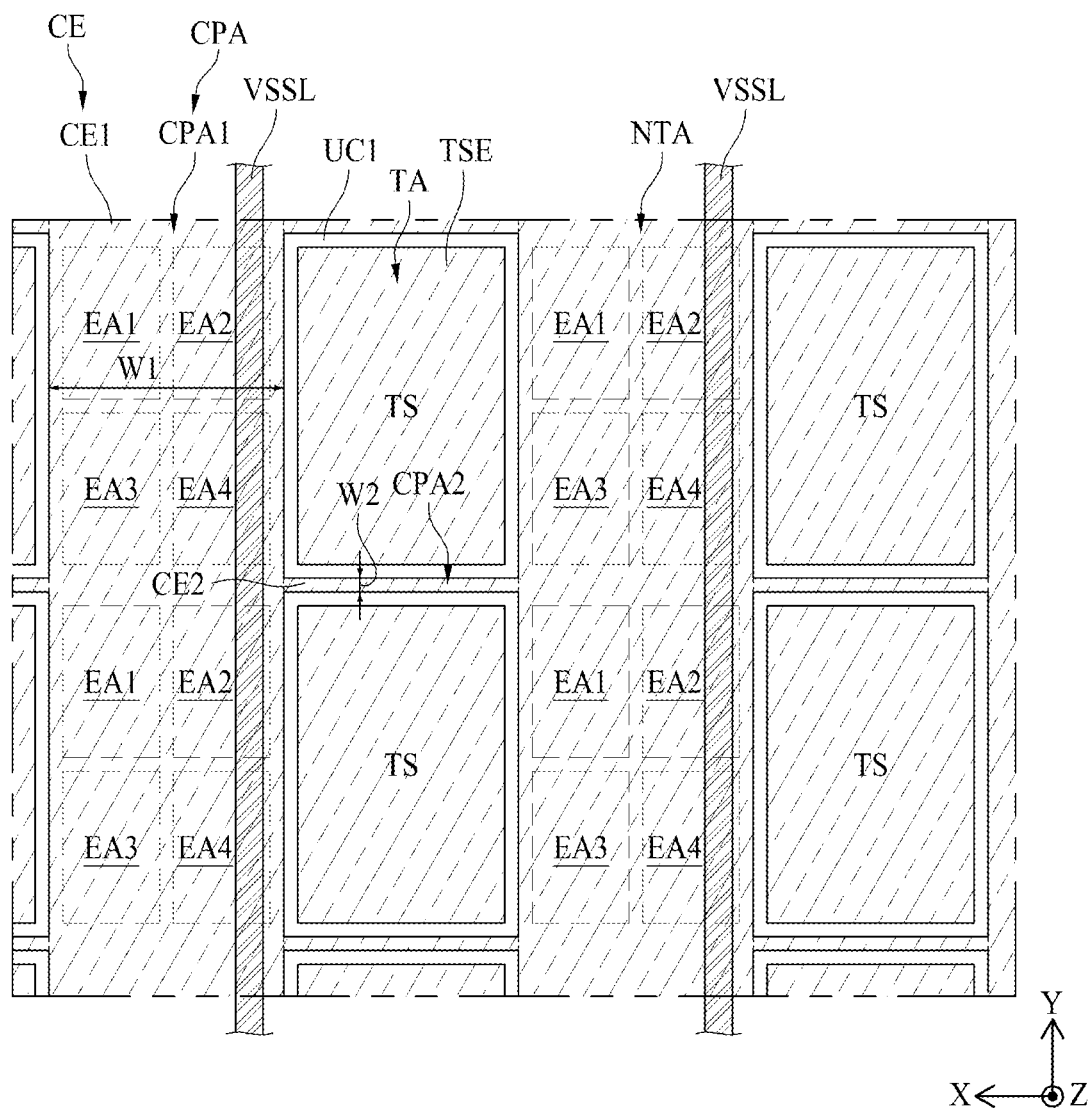
FIG. 17 is a view illustrating an example that a high resistance area is formed in a second cathode power area.
Figure 18:
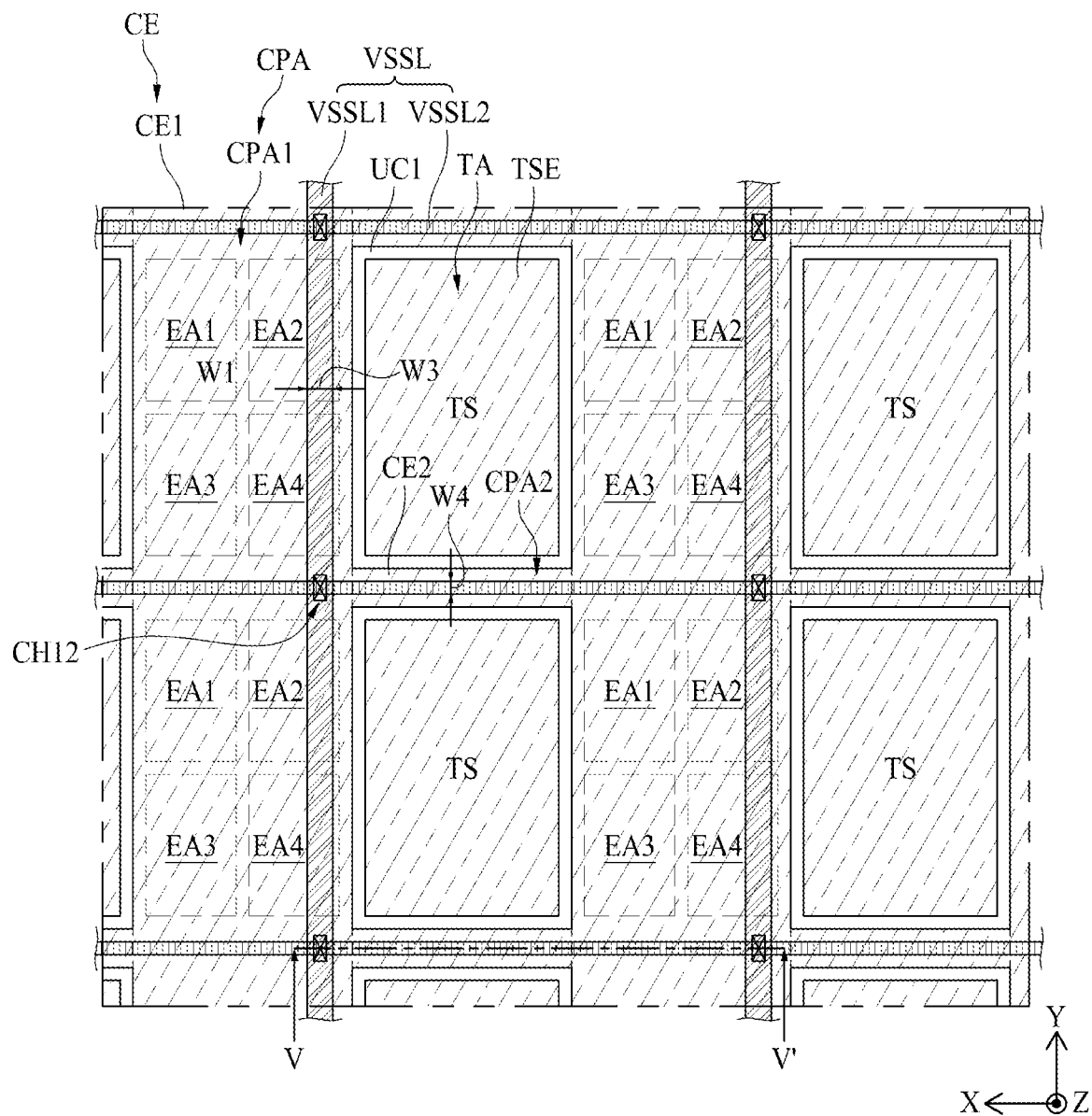
FIG. 18 is a view illustrating another example that a high resistance area is formed in a second cathode power area.
Figure 19:
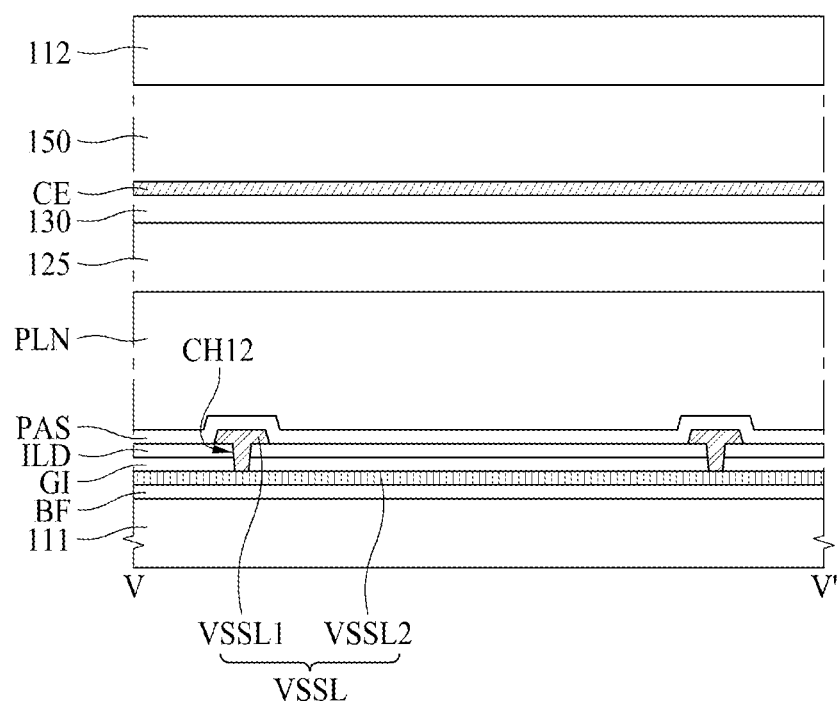
FIG. 19 is a cross-sectional view taken along line V-V' of FIG. 18.
Figure 20A:
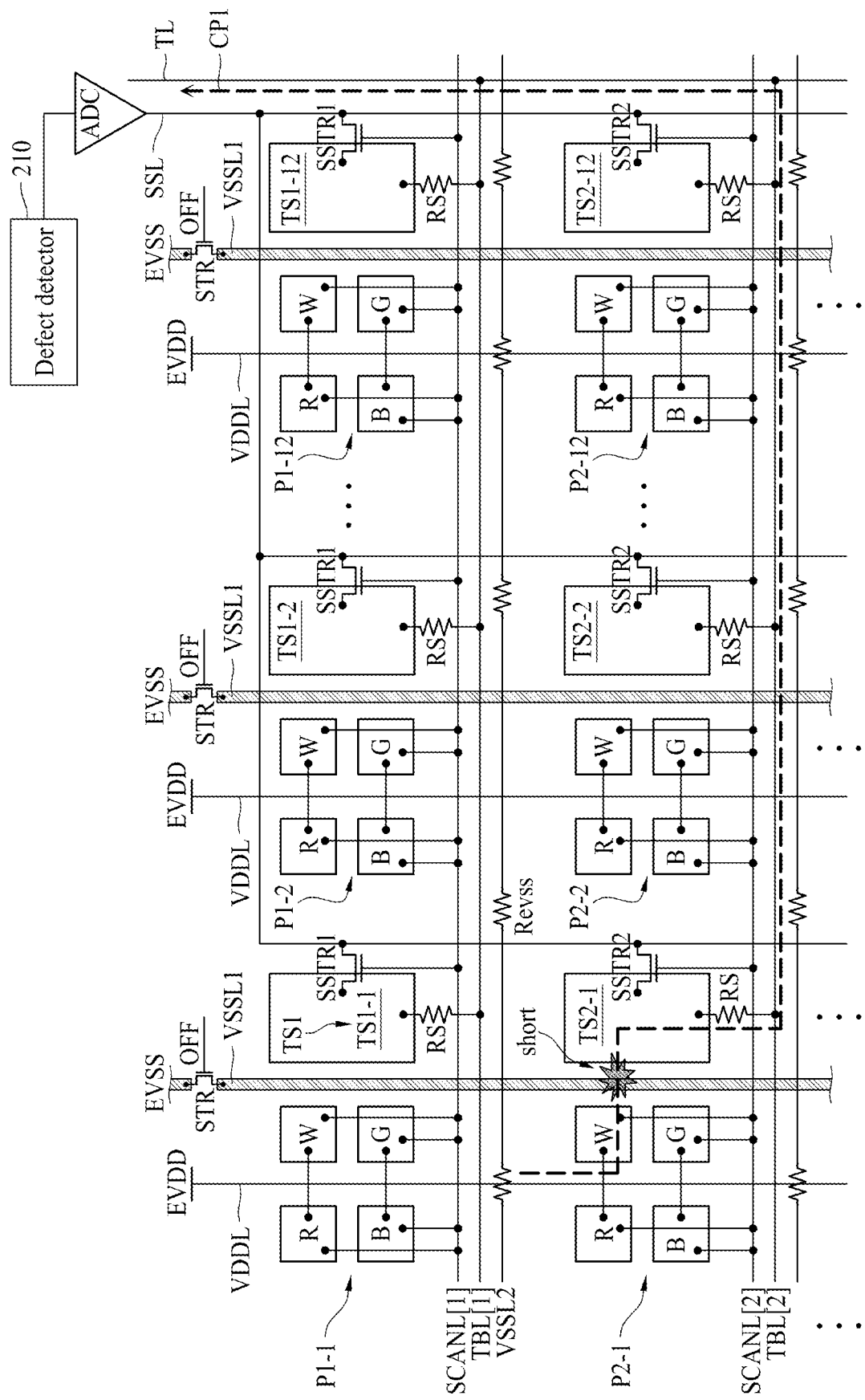
FIGS. 20A to 20C are views illustrating a current path when a defective touch sensor occurs.
Figure 20B:
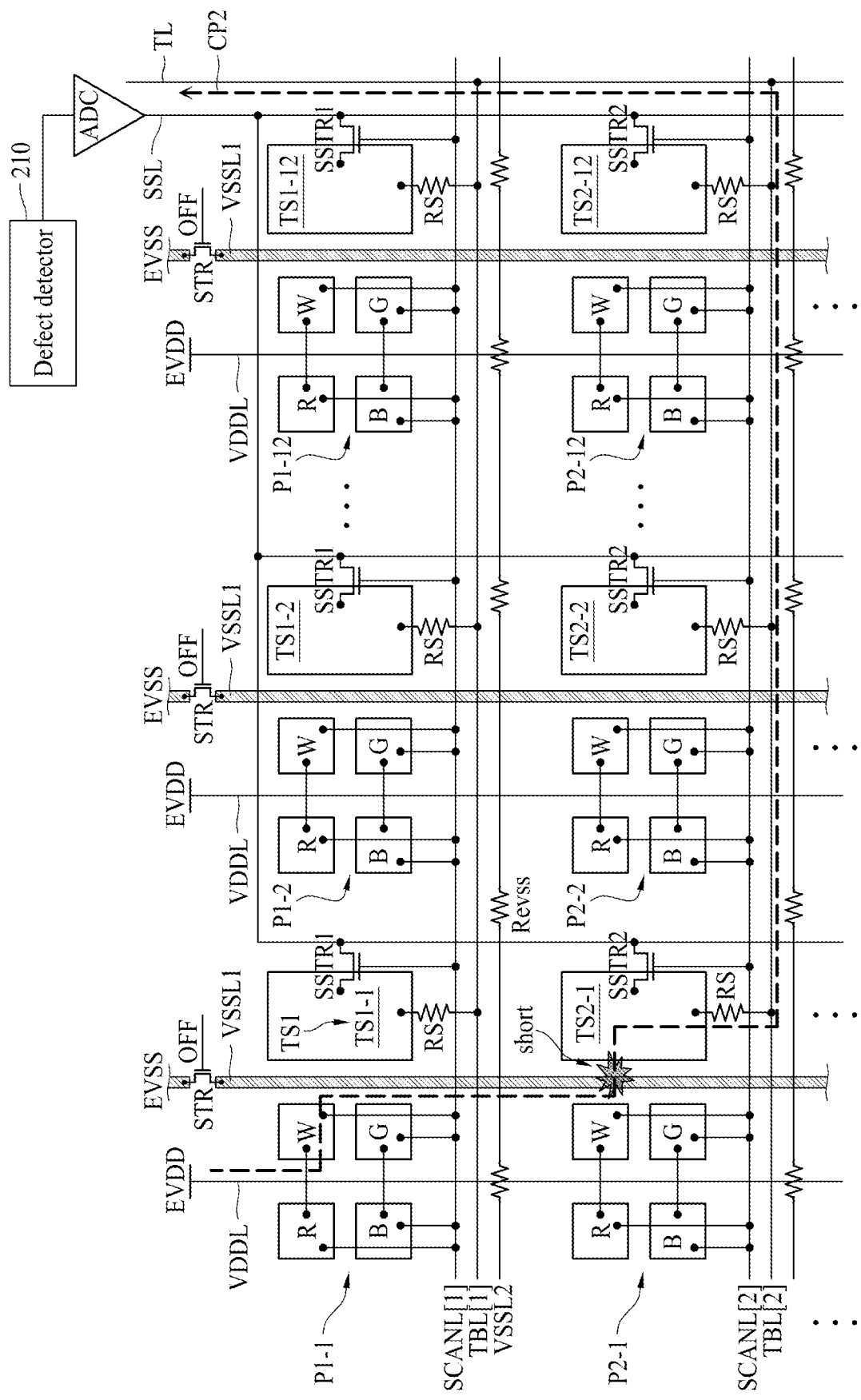
Figure 20C:
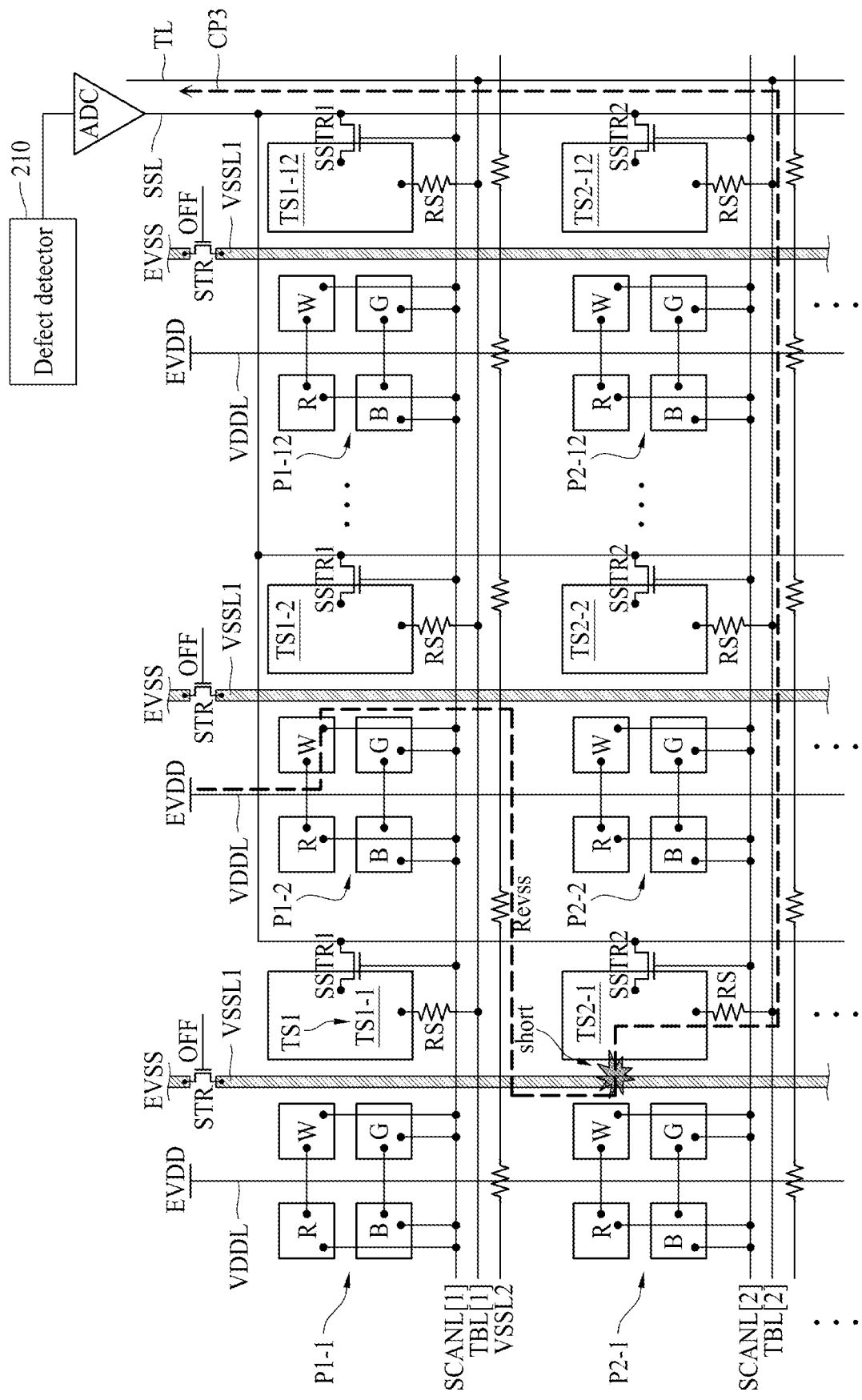
Figure 21:
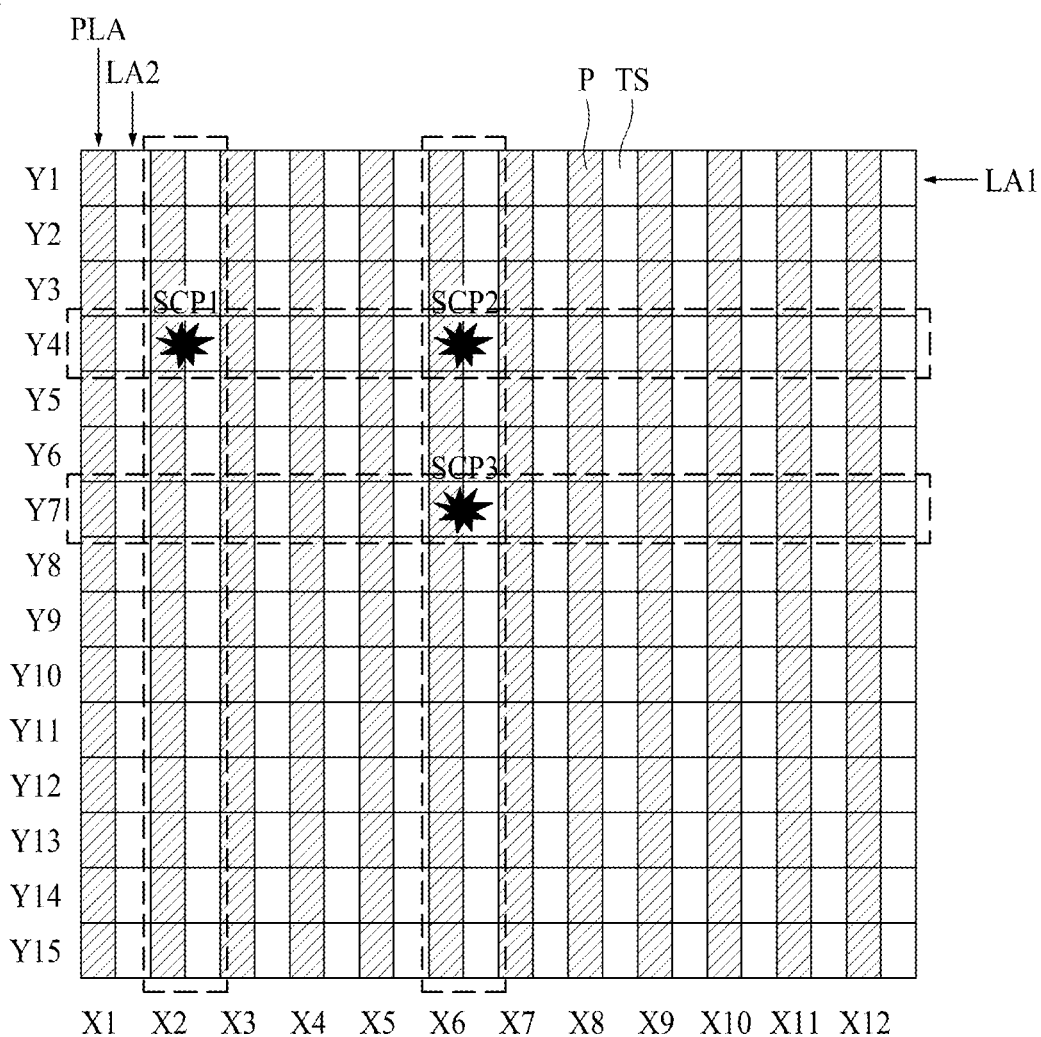
FIG. 21 is a view illustrating an example that a defective touch sensor occurs in one touch block.
Figure 22:
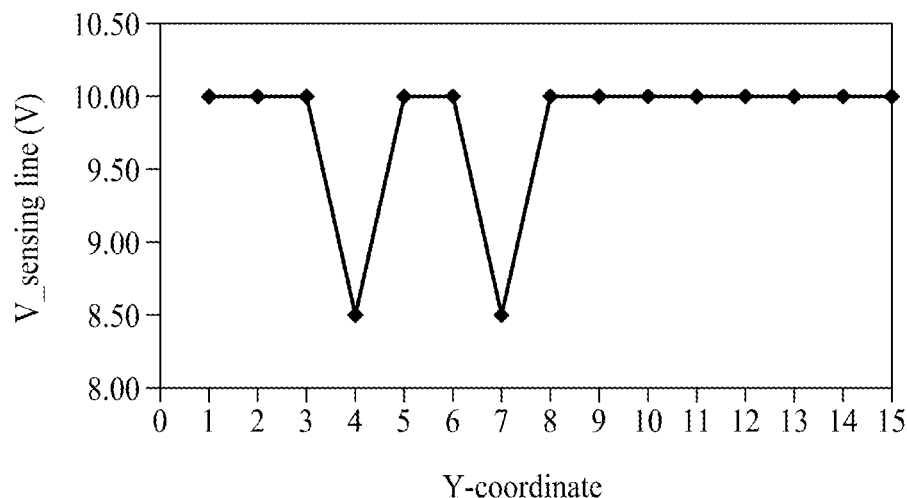
FIG. 22 is a graph illustrating a voltage per first line area of a plurality of touch sensors provided in the touch block of FIG. 21.
Figure 23:
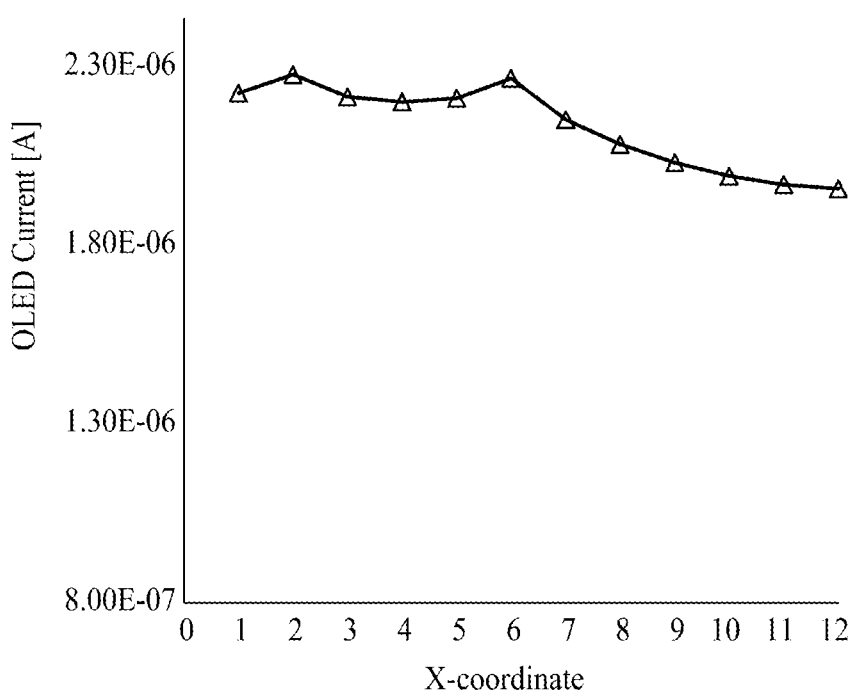
FIG. 23 is a graph illustrating a current per pixel line area of a plurality of pixels provided in the touch block of FIG. 21.

FIG. 17 is a view illustrating an example that a high resistance area is formed in a second cathode power area, and FIG. 18 is a view illustrating another example that a high resistance area is formed in a second cathode power area. FIG. 19 is a cross-sectional view taken along line V-V' of FIG. 18. FIGS. 20A to 20C are views illustrating a current path when a defective touch sensor occurs. FIG. 21 is a view illustrating an example that a defective touch sensor occurs in one touch block, FIG. 22 is a graph illustrating a voltage per first line area of a plurality of touch sensors provided in the touch block of FIG. 21, and FIG. 23 is a graph illustrating a current per pixel line area of a plurality of pixels provided in the touch block of FIG. 21.

As shown in FIGS. 17 and 18, in the transparent display panel 110 according to another embodiment of the present disclosure, a second high resistance area may be provided in a cathode power area CPA to which a cathode power source is applied, and a second line area in which a defective touch sensor TS is included may be detected using the second high resistance area.

In detail, the non-transmissive area NTA may include a cathode power area CPA to which a cathode power source is applied. The cathode power area CPA may include a first cathode power area CPA1 provided between two touch sensors TS adjacent to each other in the second direction (X-axis direction) and a second cathode power area CPA2 provided between two touch sensors TS adjacent to each other in the first direction (Y-axis direction).

The transparent display panel 110 according to another embodiment of the present disclosure is characterized in that the second cathode power area CPA2 has resistance higher than that of the first cathode power area CPA1. In one embodiment, the second cathode power area CPA2 may be a second high resistance area having resistance of 1 kΩ or more.

One of methods for implementing the second cathode power area CPA2 as the second high resistance area may form the cathode electrode CE to be thin as shown in FIG. 17.

The cathode electrode CE may include a first cathode electrode CE1 and a second cathode electrode CE2. The first cathode electrode CE1 may be disposed to at least partially overlap the common power line VSSL extended in the first direction (Y-axis direction). The first cathode electrode CE1 may be connected to the common power line VSSL through the power connection line VCL and the cathode contact electrode CCT so that a cathode power source from the common power line VSSL may be applied thereto. The first cathode electrode CE1 may be provided in the first cathode power area CPA1, and may have a first width W1.

The second cathode electrode CE2 may be provided in the second cathode power area CPA2, and may have a second width W2. The second cathode electrode CE2 is in contact with the first cathode electrode CE1, and the cathode power source from the common power line VSSL may be applied thereto through the first cathode electrode CE1.

In the transparent display panel 110 according to another embodiment of the present disclosure, the second width W2 of the second cathode electrode CE2 is thinner than the first width W1, so that the second cathode electrode CE2 may have resistance of 1 kΩ or more. In one embodiment, the second cathode electrode CE2 may have a second width W2 smaller than 50 μm. Therefore, high resistance of 1 kΩ or more may be implemented in the second cathode power area CPA2 provided with the second cathode electrode CE2.

The other one of the methods for implementing the second cathode power area CPA2 as the second high resistance area may form the common power line VSSL to be made of a high resistance material as shown in FIGS. 18 and 19.

The common power line VSSL may include a first common power line VSSL1 and a second common power line VSSL2. The first common power line VSSL1 may be provided in the first cathode power area CPA1 and extended in the first direction (Y-axis direction). The first common power line VSSL1 may include a plurality of layers. The first common power line VSSL1 may include a first line provided in the first layer and a second line provided in the second layer, wherein the first line and the second line may be electrically connected to each other through a contact hole. For example, the first common power line VSSL1 may include a first line provided in the same layer as the source electrode SE1 and the drain electrode DE1 of the driving transistor DTR and a second line provided in a layer provided in the same layer as the gate electrode GE1 of the driving transistor DTR. The first common power line VSSL1 may have a third width W3. The first common power line VSSL1 may be connected to the cathode electrode CE through the power connection line VCL and the cathode contact electrode CCT to apply the cathode power source to the cathode electrode CE.

The second common power line VSSL2 may be extended in the second direction (X-axis direction). The second common power line VSSL2 may be connected to the first common power line VSSL1 through a twelfth contact hole CH12, so that the cathode power source may be applied thereto through the first common power line VSSL1.

In the transparent display panel 110 according to another embodiment of the present disclosure, the second common power line VSSL2 may include a high resistance material, so that the second common power line VSSL2 may have resistance of 1 kΩ or more. In one embodiment, the second common power line VSSL2 may include a silicon-based semiconductor material or an oxide-based semiconductor material. For example, the second common power line VSSL2 may include the same material as that of the active layer ACT1 of the driving transistor DTR in the same layer as the active layer ACT1 of the driving transistor DTR as shown in FIG. 19. The second common power line VSSL2 provided in the same layer as the active layer ACT1 may be connected to the first common power line VSSL1 provided in the same layer as the source electrode SE1 and the drain electrode DE1 through the twelfth contact hole CH12.

The second common power line VSSL2 may have a fourth width W4 smaller than the third width W3. Since the second common power line VSSL2 is thinly formed of a silicon-based semiconductor material or an oxide-based semiconductor material as compared with the first common power line VSSL1 and is formed of a single layer, the second common power line VSSL2 may have high resistance. High resistance of 1 kΩ or more may be implemented in the second cathode power area CPA2 provided in the second common power line VSSL2.

In the transparent display panel 110 according to another embodiment of the present disclosure, the resistance area having high resistance of 1 kΩ or more may be provided in the cathode power area CPA as described above, whereby the line area in which the defective touch sensor TS is included may be detected.

Referring to FIGS. 20A to 20C, in the transparent display panel 110 according to another embodiment of the present disclosure, the common power line VSSL may be floated to detect the defective touch sensor TS. The transparent display panel 110 according to another embodiment of the present disclosure may further include a switching transistor STR to float the common power line VSSL. The switching transistor STR may connect or disconnect the common power line VSSL to or from a cathode power supply source in accordance with a control signal. The switching transistor STR may separate the common power line VSSL from the cathode power supply source in accordance with a defect detection control signal of a turn-off level. When the switching transistor STR is turned off, the common power line VSSL may be in a floating state. In addition, the switching transistor STR may connect the common power line VSSL to the cathode power supply source in accordance with a general control signal of a turn-on level. When the switching transistor STR is turned on, a cathode power source EVSS from the cathode power supply source may be applied to the common power line VSSL. The common power line VSSL may transfer the cathode power source EVSS to the cathode electrode CE.

In the transparent display panel 110 according to another embodiment of the present disclosure, a third voltage, for example, 24V may be applied to the pixel power line VDDL, and a fourth voltage lower than the third voltage, for example, 0V may be applied to the touch line TL. At this time, the pixel power line VDDL may supply a first power source EVDD and the pixel power line VDDL may be connected to each of subpixels R, W, B and G of pixels P1, P2, P3 and P4. The touch line TL may be connected to each of a plurality of touch sensors TS1 and TS2 through the touch bridge line TBL.

When a short-circuit occurs between the touch sensor electrode TSE of a touch sensor TS2-1 and the cathode electrode CE of a pixel P2-1, the touch sensor electrode TSE of the defective touch sensor TS2-1 may be electrically connected to the cathode electrode CE of the defective pixel P2-1. In this case, a first current may be generated from the pixel power line VDDL of the third voltage to the touch line TL of the fourth voltage as shown in FIG. 20A. In detail, a first current flows from the pixel power line VDDL to the touch sensor electrode TSE of the defective touch sensor TS2-1 by passing through the cathode electrode CE of the defective pixel P2-1, and flows from the touch sensor electrode TSE of the defective touch sensor TS2-1 to the touch line TL by passing through the touch bridge line TBL, whereby a first current path CP1 may be formed.

Meanwhile, the current may be generated between peripheral pixels P1-1, P1-2 and P2-2 and the defective touch sensor TS2-1 in addition to the defective pixel P2-1. As shown in FIG. 20B, a second current may be generated between the first normal pixel P1-1 and the defective touch sensor TS2-1. In this case, the first normal pixel P1-1 may be a normal pixel connected to the same pixel power line VDDL as that of the defective pixel P2-1, and may include pixels disposed in the first direction (Y-axis direction) from the defective pixel P2-1.

In detail, the second current flows from the pixel power line VDDL to the touch sensor electrode TSE of the defective touch sensor TS2-1 by passing through the cathode electrode CE of the first normal pixel P1-1 and the cathode electrode CE of the defective pixel P2-1 and flows from the touch sensor electrode TSE of the defective touch sensor TS2-1 to the touch line TL by passing through the touch bridge line TBL, whereby a second current path CP2 may be formed.

At this time, the second current may flow from the cathode electrode CE of the first normal pixel P1-1 to the cathode electrode CE of the defective pixel P2-1 through the first cathode electrode CE1 provided in the first cathode power area CPA1 extended in the first direction (Y-axis direction) or the first common power line VSSL1. The first common power line VSSL1 may include a plurality of layers, and may have a third width W3 that is wider than that of the second common power line VSSL2. In addition, the first cathode electrode CE1 may have a first width W1 that is wider than that of the second cathode electrode CE2. As a result, the first cathode power area CPA1 may have low resistance. Therefore, even though the second current passes through the first cathode electrode CE1 provided in the first cathode power area CPA1 or the first common power line VSSL1 between the cathode electrode CE of the first normal pixel P1-1 and the cathode electrode CE of the defective pixel P2-1, its amount may not be significantly reduced. That is, the second current may be equal to or similar to the first current.

As shown in FIG. 20C, a third current may be generated between the second normal pixel P1-2 and the defective touch sensor TS2-1. In this case, the second normal pixel P1-2 may be a normal pixel connected to the pixel power line VDDL different from the pixel power line VDDL to which the defective pixel P2-1 is connected, and may include pixels disposed in the second direction (X-axis direction) from the defective pixel P2-1.

In detail, the third current flows from the pixel power line VDDL to the touch sensor electrode TSE of the defective touch sensor TS2-1 by passing through the cathode electrode CE of the second normal pixel P1-2 and the cathode electrode CE of the defective pixel P2-1 and flows from the touch sensor electrode TSE of the defective touch sensor TS2-1 to the touch line TL by passing through the touch bridge line TBL, whereby a third current path CP3 may be formed.

At this time, the third current may flow from the cathode electrode CE of the second normal pixel P1-2 to the cathode electrode CE of the defective pixel P2-1 through the second cathode electrode CE2 provided in the second cathode power area CPA2 extended in the second direction (X-axis direction) or the second common power line VSSL2. The second common power line VSSL2 may include a single layer, may be made of a silicon-based semiconductor material or an oxide-based semiconductor material, and may have a fourth width W4 that is thinner than that of the first common power line VSSL1. In addition, the second cathode electrode CE2 may have a second width W2 that is thinner than that of the first cathode electrode CE1. As a result, the second cathode power area CPA2 may have high resistance Revss. Therefore, when the third current passes through the second cathode electrode CE2 provided in the second cathode power area CPA2 or the second common power line VSSL2 between the cathode electrode CE of the second normal pixel P1-2 and the cathode electrode CE of the defective pixel P2-1, its amount may be significantly reduced by high resistance Revss. That is, the amount of the third current may be smaller than the first current or the second current.

Consequently, the current flows to the second normal pixel P1-2 disposed in the second direction (X-axis direction) in the defective pixel P2-1 at a smaller amount than that of the defective pixel P2-1. Therefore, luminance of the second normal pixel P1-2 may be smaller than that of the defective pixel P2-1. Further, as the normal pixels P1-1, P1-2, ..., P1-12, P2-2, ..., P2-12 disposed near the defective pixel P2-1 become far away from the defective pixel P2-1 in the second direction (X-axis direction), a length of the normal pixels, which pass through the second cathode electrode CE2 provided in the second cathode power area CPA2 or the second common power line VSSL2, is increased, whereby the amount of the current that is reduced may be increased. Therefore, as the normal pixels P1-1, P1-2, ..., P1-12, P2-2, ..., P2-12 become far away from the defective pixel P2-1 in the second direction (X-axis direction), their luminance may be reduced.

Meanwhile, since all of the first current, the second current and the third current pass through the defective pixel P2-1, the defective pixel P2-1 may have luminance higher than that of the pixels P1-1, P1-2, ..., P1-12, P2-2, ..., P2-12 adjacent thereto. Therefore, when the third voltage and the fourth voltage are applied to the pixel power line VDDL and the touch line TL, respectively, a bright line in the first direction (Y-axis direction) may occur in a point in which a short-circuit occurs, between the touch sensor electrode TSE of the touch sensor TS and the cathode electrode CE of the pixel P. In the transparent display panel 110 according to another embodiment of the present disclosure, a second line area in which the defective touch sensor TS is included may be detected in one touch block TB by using the fact that the bright line in the first direction (Y-axis direction) occurs in the point in which a short-circuit occurs.

In the transparent display panel 110 according to another embodiment of the present disclosure, a first line area in which the defective touch sensor TS and a second line area in which the defective touch sensor TS is included may be detected in one touch block TB. In addition, in the transparent display panel 110 according to another embodiment of the present disclosure, a touch sensor TS provided in an area where the first line area and the second line area cross each other may be detected as a defective touch sensor.

In detail, the defect detector 210 may detect a touch block TB, in which the defective touch sensor TS is included, by sensing the plurality of touch lines TL connected to the plurality of touch blocks TB one-to-one. As shown in FIG. 21, one touch block TB may include a plurality of first line areas LA1 in which the plurality of touch sensors TS are disposed in a line in the second direction (X-axis direction), a plurality of second line areas LA2 in which the plurality of touch sensors TS are disposed in a line in the first direction (Y-axis direction), and a plurality of pixel line areas PLA in which the plurality of pixels P are disposed in a line in the first direction (Y-axis direction). The plurality of pixel line areas PLA may be disposed to correspond to the plurality of second line areas LA2 one-to-one, and the pixel power line VDDL may be provided in each of the plurality of pixel line areas PLA.

In the transparent display panel 110 according to another embodiment of the present disclosure, the first line area LA1, in which the defective touch sensor is included, among the plurality of first line areas LA1 may be detected using the sensing transistor SSTR and the first high resistance area. Accordingly, in some embodiments, the defect detector 210 may control the first voltage, for example, 24V to be applied to the touch line TL and control the second voltage, for example, 0V to be applied to the common power line VSSL. When the plurality of sensing transistors SSTR are sequentially turned on in accordance with the scan signal applied through the scan line SCANL, the sensing line SSL may sense the voltages of the plurality of touch sensors TS per first line area LA1. The defect detector 210 may detect the first line area LA1, in which the defective touch sensor is included, based on the voltage per first line area LA1 of the plurality of touch sensors TS, which is sensed through the sensing line SSL. The defect detector 210 may determine the first line area LA1 in which the voltage sensed through the sensing line SSL is smaller than a reference value, as the first line area LA1 in which the defective touch sensor TS is included.

Also, in the transparent display panel 110 according to another embodiment of the present disclosure, the second line area LA2, in which the defective touch sensor is included, among the plurality of second line areas LA2 may be detected using the second high resistance area of the cathode power area CPA. Accordingly, in some embodiments, the defect detector 210 may control the switching transistor STR to be turned off, thereby separating the common power line VSSL from the cathode power supply source. The defect detector 210 may control the third voltage, for example, 24V to be applied to the pixel power line VDDL, and may control the fourth voltage, for example, 0V to be applied to the touch line TL.

The defect detector 210 may sense the current per pixel line area PLA of the plurality of pixels P through the pixel power line VDDL provided in each of the plurality of pixel line areas PLA. Also, the defect detector 210 may detect the second line area LA2, in which the defective touch sensor is included, based on the current per pixel line area PLA of the plurality of pixels. The defect detector 210 may check the pixel line area PLA having a current higher than that of a left pixel line area PLA and a right pixel line area PLA, which are adjacent thereto, and may determine the second line area LA2 corresponding to the corresponding pixel line area PLA as a second line area LA2 in which the defective touch sensor TS is included.

For example, one touch block TB may include three short-circuit points SCP1, SCP2 and SCP3 as shown in FIG. 21. The voltage per first line areas LA1 of the touch block TB may appear as shown in FIG. 22. Referring to FIG. 22, the voltage of the first line area LA1 of a fourth line Y4 and the voltage the first line area LA1 of a seventh line Y7 may be lower than those of the other first line area LA1. In this case, the defective touch sensor may be included in the first line area LA1 of the fourth line Y4 and the first line area LA1 of the seventh line Y7.

Also, the current per pixel line area PLA of the touch block TB may appear as shown in FIG. 23. Referring to FIG. 23, the current of the pixel line area PLA of a second line X2 and the current of the pixel line area PLA of a sixth line X6 may be higher than those of the other pixel line areas PLA. In this case, the defective touch sensor may be included in the second line area LA2 of the second line X2 and the second line area LA2 of the sixth line X6.

The defect detector 210 may detect a touch sensor TS provided in an area, in which the first line area LA1 of the fourth line Y4 area and the second line area LA2 of the second line X2 cross each other, as the defective touch sensor. In addition, the defect detector 210 may detect a touch sensor TS provided in an area, in which the first line area LA1 of the fourth line Y4 and the second line area LA2 of the sixth line X6 cross each other, as the defective touch sensor. In addition, the defect detector 210 may detect a touch sensor TS provided in an area, in which the first line area LA1 of the seventh line Y7 and the second line area LA2 of the sixth line X6 cross each other, as the defective touch sensor. As described above, in the transparent display panel 110 according to another embodiment of the present disclosure, the defective touch sensor TS may be detected in the touch block TB in a unit of pixel.

In the transparent display panel 110 according to another embodiment of the present disclosure, the touch connection line TCL connected to the defective touch sensors TS may be cut by a laser, whereby the defective touch sensor TS and the touch bridge line TCL may be electrically separated from each other. Therefore, the transparent display panel 110 according to another embodiment of the present disclosure may allow the other touch sensors TS of the corresponding touch block TB to operate normally.

In the transparent display panel 110 according to another embodiment of the present disclosure, the defective touch sensor TS may be exactly detected in one touch block TB in a unit of pixel. Therefore, the transparent display panel 110 according to another embodiment of the present disclosure may reduce a touch defect rate and improve a touch recognition rate.

According to the present disclosure, the following advantageous effects may be obtained.

In the present disclosure, the touch sensor electrode of the touch sensor and the cathode electrode of the light emitting element may be formed using the first undercut structure at the same time, so that the touch process may be simplified and a separate mask for the touch sensor electrode is not additionally required.

Also, in the present disclosure, the line area in which the defective touch sensor is included may be easily detected in one touch block. In addition, in the present disclosure, the defective touch sensor may be exactly detected in one touch block. Therefore, the present disclosure may reduce a touch defect rate and improve a touch recognition rate.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device with a touch sensor, the transparent display device comprising:
   a plurality of transmissive areas and a non-transmissive area disposed between the transmissive areas adjacent to each other;
   a plurality of pixels provided in the non-transmissive area, including a plurality of subpixels;
   a touch block including a plurality of touch sensors disposed in the plurality of transmissive areas;
   a plurality of touch connection portions respectively coupled to the plurality of touch sensors, transferring a touch sensing voltage to the coupled touch sensor and including a first high resistance area;
   a plurality of sensing transistors respectively coupled to the plurality of touch sensors, sensing a voltage of the coupled touch sensor;
   a sensing line provided in the non-transmissive area and electrically connected to the plurality of sensing transistors; and
   a plurality of scan lines provided in the non-transmissive area, supplying a scan signal to each of the plurality of sensing transistors,
   wherein each of the plurality of sensing transistors is turned on in response to the scan signal to transfer a voltage of the connected touch sensor to the sensing line.

2. The transparent display device of claim 1, wherein the touch block is provided as a plurality of touch blocks, and each of the plurality of touch blocks senses voltages of a plurality of touch sensors through one sensing line.

3. The transparent display device of claim 1, wherein the sensing line senses the voltages of the plurality of touch sensors per scan line.

4. The transparent display device of claim 1, wherein the first high resistance area at least partially overlaps the touch sensor.

5. The transparent display device of claim 1, wherein each of the plurality of touch connection portions includes a resistance sensor provided in the first high resistance area.

6. The transparent display device of claim 5, wherein the resistance sensor includes a high resistance line made of a silicon-based semiconductor material or an oxide-based semiconductor material.

7. The transparent display device of claim 1, wherein each of the plurality of touch connection portions includes a resistance transistor provided with an active layer, a gate electrode, a source electrode, and a drain electrode in the first high resistance area.

8. The transparent display device of claim 1, wherein the plurality of touch sensors correspond to the plurality of pixels one-to-one.

9. The transparent display device of claim 1, wherein each of the plurality of subpixels includes a light emitting element provided with an anode electrode, a light emitting layer, and a cathode electrode, and each of the plurality of touch sensors includes a touch sensor electrode, and
   wherein the cathode electrode constituting the light emitting element and the touch sensor electrode constituting the touch sensor are provided in a same layer.

10. The transparent display device of claim 9, further comprising a first undercut structure provided in the transmissive area, having a planar closed shape, wherein the cathode electrode and the touch sensor electrode are separated from each other by the first undercut structure.

11. The transparent display device of claim 9, further comprising a sensing line detecting whether a short-circuit occurs between the cathode electrode and the touch sensor electrode,
   wherein each of the sensing transistors is electrically connected to the sensing line to transfer a voltage applied to the coupled touch sensor electrode to the sensing line.

12. The transparent display device of claim 11, further comprising:
   a common power line provided in the non-transmissive area and electrically connected to the cathode electrode;
   a touch line provided in the non-transmissive area and electrically connected to the touch sensor electrode;
   a plurality of scan lines provided in the non-transmissive area, supplying a scan signal to the plurality of pixels or the plurality of sensing transistors;
   a plurality of first line areas in which the plurality of touch sensors are disposed in a line in a direction in which the scan line is extended; and
   a defect detector controlling a first voltage and a second voltage to be applied to the common power line and the touch line, respectively, sensing voltages of the touch sensors for each of the first line areas through the sensing line and determining a first line area, in which a defective touch sensor is included, among the plurality of first line areas based on the sensed voltage for each first line area.

13. The transparent display device of claim 9, further comprising:
   a common power line supplying a cathode power source to the cathode electrode of the light emitting element; and
   a cathode power area to which the cathode power source is applied through the common power line,
   wherein the cathode power area includes a first cathode power area disposed between touch sensors adjacent to each other in a second direction and a second cathode power area disposed between touch sensors adjacent to each other in the first direction, and
   wherein the second cathode power area is a second high resistance area having resistance of 1KΩ or more.

14. The transparent display device of claim 13, wherein the common power line includes a first common power line provided in a first layer in the first cathode power area and a second common power line provided in a second layer in the second cathode power area, and
   wherein the second common power line is made of a silicon-based semiconductor material or an oxide-based semiconductor material.

15. The transparent display device of claim 13, further comprising:
   a plurality of second line areas in which the plurality of touch sensors are disposed in a line in a direction in which the common power line is extended;
   a pixel power line electrically connected to the anode electrode of the light emitting element;
   a touch line electrically connected to the touch sensor; and
   a defect detector controlling a third voltage and a fourth voltage to be applied to the pixel power line and the touch line, respectively, and determining a second line area, in which a defective touch sensor is included, among the plurality of second line areas based on a current or luminance of the plurality of pixels emitting light by a current generated between the pixel power line and the touch line.

16. A transparent display device with a touch sensor, the transparent display device comprising:
   a substrate provided with a transmissive area and a non-transmissive area;
   a touch sensor provided in the transmissive area over the substrate, including a touch sensor electrode;
   a light emitting element provided in the non-transmissive area over the substrate, including an anode electrode, a light emitting layer, and a cathode electrode;
   a sensing line detecting whether a short-circuit occurs between the cathode electrode and the touch sensor electrode;
   a sensing transistor electrically connecting the touch sensor electrode of the touch sensor with the sensing line; and
   a scan line supplying a scan signal to the sensing transistor.

17. The transparent display device of claim 16, wherein the sensing transistor is turned on in response to the scan signal to transfer a voltage applied to the touch sensor electrode to the sensing line.

18. The transparent display device of claim 16, further comprising:
   a plurality of touch lines extended in the non-transmissive area in a first direction; and
   a touch connection portion electrically connecting the touch sensor electrode of the touch sensor with one of the plurality of touch lines and including a first high resistance area.

19. The transparent display device of claim 18, wherein the touch connection portion includes a high resistance line made of a silicon-based semiconductor material or an oxide-based semiconductor material in the first high resistance area.

20. The transparent display device of claim 18, wherein the touch connection portion includes a resistance transistor provided with an active layer, a gate electrode, a source electrode, and a drain electrode in the first high resistance area.

21. The transparent display device of claim 20, wherein the resistance transistor includes a first resistance transistor electrically connected to the touch sensor electrode of the touch sensor and a second resistance transistor electrically connected to the first resistance transistor and one of the plurality of touch lines, and
   wherein a gate electrode of each of the first resistance transistor and the second resistance transistor is electrically connected to a source electrode or a drain electrode.

22. The transparent display device of claim 18, wherein the sensing line is disposed between the plurality of touch lines and the transmissive area.

23. The display device of claim 16, wherein the sensing transistor is turned on in response to a scan signal supplied by the scan line to transfer a voltage applied to the touch sensor electrode to the sensing line.

24. The transparent display device of claim 16, wherein the cathode electrode of the light emitting element and the touch sensor electrode of the touch sensor are provided in a same layer.

25. A display device comprising:
   a touch sensor including a touch sensor electrode;
   a light emitting element including an anode electrode, a light emitting layer, and a cathode electrode;

a sensing line that in operation detects whether a short-circuit occurred between the cathode electrode and the touch sensor electrode of the touch sensor;

a scan line adjacent to the touch sensor;

a touch bridge line coupled to receive power from a power supply line;

a touch line coupled to the touch bridge line;

a sensing transistor having a first electrode, a second electrode, and a gate electrode, the first electrode coupled to the touch sensor and the second electrode coupled to the sensing line, the gate electrode coupled to the scan line, the sensing transistor overlapping the touch sensor;

an electrical component coupled between the touch sensor and the touch bridge line, wherein when the short-circuit occurs, a current passes from the power supply line, through the touch sensor electrode, the electrical component, the touch bridge line, and the touch line.

26. The display device of claim 25, wherein the electrical component is a resistance sensor including a high resistance line, wherein the resistance sensor reduces a voltage of the touch sensor, when the short-circuit occurs.

27. The display device of claim 25, wherein the electrical component is a resistance transistor, wherein the resistance transistor has a highest resistance in a turned-off state of the resistance transistor, and wherein at the turned-off state of the resistance transistor, a voltage of the touch sensor is sensed through the sensing line.

28. The display device of claim 25, wherein the electrical component is at least two resistance transistors, wherein the at least two resistance transistors include a first resistance transistor and a second resistance transistor coupled in series, wherein the first resistance transistor has a first electrode coupled to the touch sensor, a second electrode coupled to the second resistance transistor, and a gate electrode coupled to the first electrode, wherein the second resistance transistor has a first electrode coupled to the second electrode of the first resistance transistor, a second electrode coupled to the touch bridge line, and a gate electrode coupled to the second electrode of the first resistance transistor.

* * * * *